(12) United States Patent
Ishida

(10) Patent No.: US 9,921,247 B2
(45) Date of Patent: Mar. 20, 2018

(54) CURRENT MEASUREMENT DEVICE, CONTROL METHOD FOR SAME, RECORDING MEDIUM, AND POWER MEASUREMENT DEVICE

(71) Applicant: OMRON CORPORATION, Kyoto-shi, Kyoto (JP)

(72) Inventor: Yui Ishida, Higashi osaka (JP)

(73) Assignee: OMRON CORPORATION, Kyoto-shi (JP)

( * ) Notice: Subject to any disclaimer, the term of this patent is extended or adjusted under 35 U.S.C. 154(b) by 0 days.

(21) Appl. No.: 15/114,473

(22) PCT Filed: Jan. 14, 2015

(86) PCT No.: PCT/JP2015/050826
§ 371 (c)(1),
(2) Date: Jul. 27, 2016

(87) PCT Pub. No.: WO2015/122230
PCT Pub. Date: Aug. 20, 2015

(65) Prior Publication Data
US 2016/0349290 A1  Dec. 1, 2016

(30) Foreign Application Priority Data
Feb. 17, 2014  (JP) .................................. 2014-027715

(51) Int. Cl.
*G01R 15/18* (2006.01)
*G01R 19/25* (2006.01)
*G01R 21/133* (2006.01)

(52) U.S. Cl.
CPC .......... *G01R 15/18* (2013.01); *G01R 19/2513* (2013.01); *G01R 21/133* (2013.01)

(58) Field of Classification Search
CPC ...... G01R 19/2513; G01R 21/133; H02J 3/38
See application file for complete search history.

(56) References Cited

U.S. PATENT DOCUMENTS 6,018,700 A    1/2000 Edel
2004/0027842 A1*  2/2004 Tanabe ................ H02M 3/3372
                                              363/133

(Continued)

FOREIGN PATENT DOCUMENTS

JP    2002-131344 A    5/2002
JP    2010-055356 A    3/2010

(Continued)

OTHER PUBLICATIONS

The English translation of the international preliminary report on patentability (Chapter I) of PCT/JP2015/050826 mailed by the International Bureau of WIPO dated Sep. 1, 2016.

(Continued)

*Primary Examiner* — Jermele M Hollington
*Assistant Examiner* — Alvaro Fortich
(74) *Attorney, Agent, or Firm* — Metrolexis Law Group, PLLC

(57) ABSTRACT

A microcomputer section operates by use of electric power from a power supply section. The microcomputer section carries out control so that any one of a plurality of switching circuits is selected, the selected one of the plurality of switching circuits causes an electric current from a corresponding current transformer of a plurality of current transformers to flow to the microcomputer section, whereas the other unselected switching circuits cause electric currents from respective current transformers of the plurality of current transformers to flow to the power supply section, and the selection is carried out successively with respect to each of the plurality of switching circuits.

14 Claims, 11 Drawing Sheets

(56) References Cited

U.S. PATENT DOCUMENTS

| | | | |
|---|---|---|---|
| 2008/0150515 A1* | 6/2008 | Ollila | H02M 5/4585 |
| | | | 324/85 |
| 2010/0118301 A1* | 5/2010 | Vondras | G01J 3/10 |
| | | | 356/318 |
| 2010/0264906 A1 | 10/2010 | Shamir et al. | |
| 2011/0121774 A1* | 5/2011 | Shimada | H02M 1/4233 |
| | | | 318/729 |
| 2011/0291488 A1 | 12/2011 | Paik et al. | |
| 2013/0245972 A1* | 9/2013 | Imai | G01R 19/2513 |
| | | | 702/60 |
| 2014/0253091 A1* | 9/2014 | Ishihara | G01R 31/041 |
| | | | 324/66 |
| 2015/0042314 A1 | 2/2015 | Imai et al. | |

FOREIGN PATENT DOCUMENTS

| | | |
|---|---|---|
| JP | 2010-181378 A | 8/2010 |
| JP | 2010-261852 A | 11/2010 |
| JP | 2013-124864 A | 6/2013 |
| JP | 2014-020966 A | 2/2014 |
| JP | 2014-055831 A | 3/2014 |
| WO | 2013/121627 A1 | 8/2013 |

OTHER PUBLICATIONS

The International Search Report for PCT/JP2015/050826 dated Mar. 17, 2015.
The extended European search report (EESR) dated Dec. 6, 2017 in a counterpart European patent application.

* cited by examiner

FIG. 6

| NUMBER OF CURRENT TRANSFORMER CT | EFFECTIVE VALUE (A) OF ELECTRIC CURRENT |
|---|---|
| 1 | 0.3 |
| 2 | 0.2 |
| 3 | 0.4 |
| 4 | 0.1 |

CURRENT MEASUREMENT DEVICE, CONTROL METHOD FOR SAME, RECORDING MEDIUM, AND POWER MEASUREMENT DEVICE

TECHNICAL FIELD

The present invention relates to an electric current measuring device for causing a current transformer provided to a power line to measure an electric current flowing through the power line, a method and a program each for controlling the electric current measuring device, a recording medium, and an electric power measuring device.

BACKGROUND ART

Industry has recently been required to achieve a reduction in amount of electric power consumption (consumption energy) (hereinafter abbreviated to "energy saving") in various electrical appliances for use in production so as to reduce production costs. Further, an ordinary household has also been required to achieve energy saving in various home electronics (domestic electrical appliances) so as to reduce electric power rates.

Energy saving generally starts with a grasp of an actual state of electric power consumption (use of electric power). Thus, it has been considered to measure electric power by providing wattmeters to indoor wires or various electrical appliances in buildings such as a factory and a house. Generally, a clamp electric current sensor is used in such a wattmeter to measure an electric current. A conventional electric power measuring device or a conventional electric current measuring device is exemplified by electric power measuring devices or electric current measuring devices disclosed in Patent Literatures 1 through 3.

An electric current sensing device disclosed in Patent Literature 1 is arranged to cause a current transformer (CT) provided to a power line to sense a system electric current. According to the electric current sensing device, a power supply section of an electric current sensing calculation and monitoring section provided on the secondary side of the CT is provided with a rectifier circuit, a constant voltage DC output circuit, a backup power supply circuit, and a level converting circuit that are located in this order from the upstream side, the level converting circuit supplying electric power to the electric current sensing calculation and monitoring section by converting an output voltage of the constant voltage DC output circuit or the backup power supply circuit to a predetermined level. In a case where the output voltage of the constant voltage DC output circuit decreases, electric power is supplied from the backup power supply circuit. This allows a single CT to sense an electric current and supply electric power.

An electric power sensing device disclosed in Patent Literature 2 is included in a sensing target device that is driven by a three-phase four-wire system power supply. According to the electric power sensing device, a voltage measuring circuit includes no transformer and is constituted by a resistance voltage-dividing circuit, and the voltage measuring circuit is connected to three power lines of the respective phases other than a neutral line of the three-phase four-wire system power supply. Meanwhile, an electric current measuring circuit is electromagnetically-coupled with the three power lines by a current transformer. Electric power generated by a power supply section of the sensing target device is supplied to an electric power receiving circuit via an interface such as a connector, and the electric power is supplied from the electric power receiving circuit to each section of the electric power sensing device, so that the electric power sensing device starts operating.

The voltage measuring circuit senses a voltage between the neutral line and each of the power lines of the three phases, and the electric current measuring circuit senses respective electric currents of the three phases by use of the current transformer. An analog output, which is a result of the measurement by each of the voltage measuring circuit and the electric current measuring circuit is digitalized by an A/D converter, and a result obtained from the A/D converter is used by a calculation section to calculate, for example, a phase voltage, a phase electric current, phase electric power, and total electric power. A result obtained from the calculation section is supplied to a communication circuit, and the result is transmitted from the communication circuit to the sensing target device via the interface such as a connector.

According to an electric power usage providing device disclosed in Patent Literature 3, one (1) power line of an alternating-current power device is provided with three core coils, and an electric power sensing section uses induced electromotive force, which is generated by a first core coil, to calculate electric power used by the alternating-current power device. A sensing electric power generating section uses induced electromotive force, which is generated by a second core coil, or uses a primary battery to supply electric power to the electric power sensing section. A communication section uses induced electromotive force, which is generated by a third core coil, or uses the primary battery to transmit the used electric power to another communication device. By thus intermittently calculating and transmitting used electric power, used electric power can be stably calculated and transmitted for a long period even in the case of electric power supply by electromagnetic induction.

CITATION LIST

Patent Literatures

[Patent Literature 1]
  Japanese Patent Application Publication, Tokukai, No. 2002-131344 (Publication Date: May 9, 2002)
[Patent Literature 2]
  Japanese Patent Application Publication, Tokukai, No. 2010-261852 (Publication Date: Nov. 18, 2010)
[Patent Literature 3]
  Japanese Patent Application Publication, Tokukai, No. 2013-124864 (Publication Date: Jun. 24, 2013)

SUMMARY OF INVENTION

Technical Problem

Note, however, that according to the electric current sensing device of Patent Literature 1, in a case where an electric current flowing through the power line provided with the CT is low, the backup power supply circuit is charged at a slower speed, the electric current cannot be measured, or a period is made longer before the electric current can be measured. The electric power measuring device of Patent Literature 2 needs to be provided with an external power source. Thus, the electric power measuring device is restricted in place at which to locate the electric power sensing device. According to the electric power usage providing device of Patent Literature 3, one (1) power line is provided with the following three core coils: a core coil for electric power sensing; a core coil for electric power generation; and a core coil for communication. This causes an increase in production cost and size of the electric power usage providing device.

The present invention has been made in view of the problems, and an object of the present invention is to (i) make, smaller in size, an electric current measuring device for causing a current transformer provided to a power line to measure an electric current flowing through the power line, and (ii) allow reliable operation of the electric current measuring device by use of an electric current from the current transformer.

Solution to Problem

In order to attain the object, an electric current measuring device in accordance with the present invention is an electric current measuring device for causing a plurality of current transformers provided to a respective plurality of power lines to measure electric currents flowing through the plurality of power lines, the electric current measuring device including: at least one electricity storing section for storing electricity by use of electric currents from the plurality of current transformers provided to the respective plurality of power lines; an electric current measuring section for measuring, in accordance with the electric currents from the plurality of current transformers, the electric currents flowing through the plurality of power lines provided with the respective plurality of current transformers; and a control section for carrying out control so that the electric current measuring section carries out the measurement in accordance with an electric current from one of the plurality of current transformers and repeats the measurement for each of the plurality of current transformers, the electric current measuring section and the control section each operating by use of electric power from the at least one electricity storing section.

In order to attain the object, a method for controlling an electric current measuring device in accordance with the present invention for causing a plurality of current transformers provided to a respective plurality of power lines to measure electric currents flowing through the plurality of power lines, the electric current measuring device including: an electricity storing section for storing electricity by use of electric currents from the plurality of current transformers provided to the respective plurality of power lines; and an electric current measuring section for measuring, in accordance with the electric currents from the plurality of current transformers, the electric currents flowing through the plurality of power lines provided with the respective plurality of current transformers, in order to cause the electric current measuring section to operate by use of electric power from the electricity storing section, the method includes the steps of: (a) causing the electric current measuring section to carry out the measurement in accordance with an electric current from one of the plurality of current transformers; and (b) repeating the step (a) for each of the plurality of current transformers.

Advantageous Effects of Invention

According to the present invention, an electric current is obtained from any one of a plurality of current transformers, an electric current flowing through a power line that is provided with the any one of the plurality of current transformers is measured in accordance with the obtained electric current, and the measurement is carried out successively with respect to each of the plurality of current transformers.

Thus, the present invention yields an effect of (i) making an electric current measuring device smaller in size and (ii) allowing reliable operation of the electric current measuring device due to storage of electricity by use of electric currents from a plurality of current transformers provided to respective plurality of power lines.

BRIEF DESCRIPTION OF DRAWINGS

FIG. 6 is a view illustrating, in a form of a table, a correspondence table of a measured value of an electric current and a number of a current transformer, the measured value and the number each being stored in a memory section of the electric current measuring unit.

DESCRIPTION OF EMBODIMENTS

Figure 1:
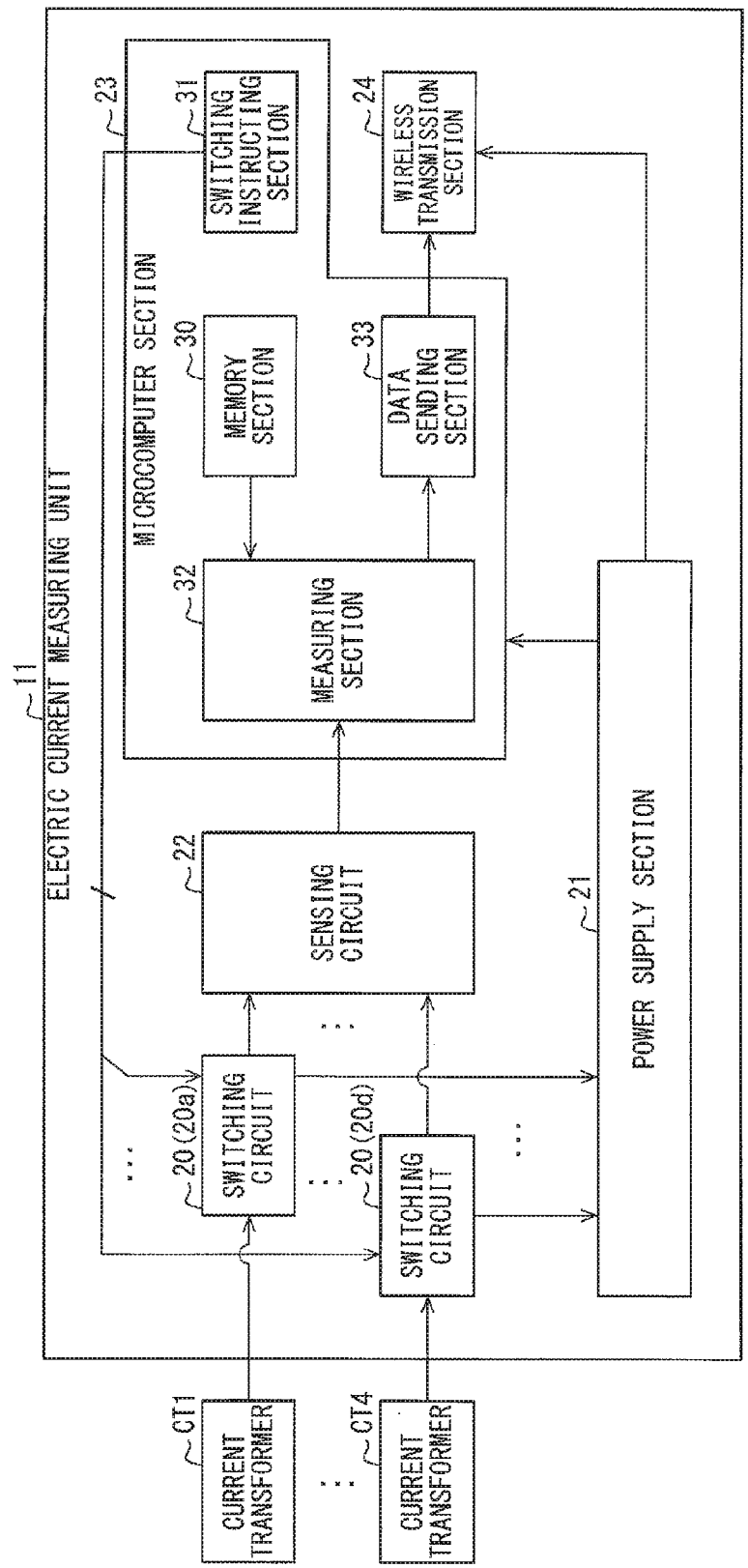
FIG. 1 is a block diagram schematically illustrating an arrangement of an electric current measuring unit of an electric current measuring system of an embodiment of the present invention.

The following description specifically discusses an embodiment of the present invention. Note that for convenience of description, members having functions identical to those of respective members described in embodiments are given respective identical reference signs, and a description of those members is omitted as appropriate.

Embodiment 1

(Overview of Electric Current Measuring System)

First, an embodiment of the present invention is described below with reference to FIGS. 1 through 3. FIG. 2 is a block diagram schematically illustrating an arrangement of an electric current measuring system of Embodiment 1.

As illustrated in FIG. 2, an electric current measuring system 10 is arranged to cause current transformers (transformers) CT1 through CT4, which are provided to a respective plurality of power lines PL1 through PL4 provided in a panel board PB, to measure effective values I1e through I4e of electric currents flowing through the plurality of power lines PL1 through PL4, and display the effective values I1e through I4e. The electric current measuring system 10 includes an electric current measuring unit (electric current measuring device) 11 and a receiving unit 12. Note that in the following description, the power lines PL1 through PL4, the current transformers CT1 through CT4, and the effective values I1e through I4e of the electric currents are written as "power lines PL", "current transformers CT", and "effective values Ie of electric currents", respectively, in a case where the power lines PL1 through PL4, the current transformers CT1 through CT4, and the effective values I1e through I4e of the electric currents are generically referred to.

A current transformer CT, which is provided to a power line PL, picks up a part of an alternating electric current (e.g., 0 A to 5 A) flowing through the power line PL. Note that since a structure of the current transformer CT is well known, a description thereof is omitted here.

The electric current measuring unit 11, which is provided in the panel board PB, measures, in accordance with electric currents from the current transformers CT1 through CT4, which are provided to the respective plurality of power lines PL1 through PL4 provided in the panel board PB, the effective values I1e through I4e of the electric currents flowing through the plurality of power lines PL1 through PL4. The electric current measuring unit 11 wirelessly transmits, to the receiving unit 12, measured data indicative of the measured effective values I1e through I4e of the electric currents.

The receiving unit 12 wirelessly receives the measured data from the electric current measuring unit 11, stores the measured data thus received, and displays measured values (the effective values I1e through I4e of the electric currents) indicated by the measured data. Note that the receiving unit 12 is described later in detail.

(Details of Electric Current Measuring Unit)

Next, the electric current measuring unit 11 is described below in detail. FIG. 1 is a block diagram schematically illustrating an arrangement of the electric current measuring unit 11. As illustrated in FIG. 1, the electric current measuring unit 11 includes a plurality of switching circuits (switching sections) 20a through 20d, a power supply section (electricity storing section) 21, a sensing circuit 22, a microcomputer section 23, and a wireless transmission section (transmission section) 24.

The plurality of switching circuits 20a through 20d is electrically connected with the respective current transformers CT1 through CT4. Note that in the following description, the plurality of switching circuits 20a through 20d is written as "switching circuits 20" in a case where the plurality of switching circuits 20a through 20d are generically referred to.

The switching circuits 20 each switch, in accordance with an instruction from the microcomputer section 23, between the power supply section 21 and the sensing circuit 22 to either of which electric currents from the current transformers CT are to flow. A switching circuit 20 is constituted by, for example, a switching element.

The power supply section 21 supplies electric power to each section (especially, the microcomputer section 23 and the wireless transmission section 24) of the electric current measuring unit 11, in which the power supply section 21 is provided. According to Embodiment 1, the power supply section 21 stores electricity by use of an electric current flowing from a current transformer CT via the switching circuit 20. The power supply section 21 includes, for example, a rectifier circuit, a capacitor, and a DC/DC conversion circuit. Note that the capacitor can be replaced with a secondary battery (storage battery). Note also that the power supply section 21 can be constituted by one (1) capacitor (electricity storing section) or one (1) secondary battery (electricity storing section), a plurality of capacitors or a plurality of secondary batteries, or a combination of a capacitor and a secondary battery.

The sensing circuit 22 senses the electric current flowing from the current transformer CT via the switching circuit 20. The sensing circuit 22 transmits, to the microcomputer section 23, a sensing signal indicative of the sensed electric current. The sensing circuit 22 includes, for example, a resistance for sensing to which resistance the electric current flows, and an operational amplifier for amplifying a voltage of the resistance for sensing.

The microcomputer section 23 includes a microcomputer including a microprocessor and a memory, and collectively controls operation of various members of the electric current measuring unit 11. The operation of the various members is controlled by causing the microprocessor to execute a control program stored in the memory.

According to Embodiment 1, the microcomputer section 23 measures, in accordance with the sensing signal from the sensing circuit 22, an electric current flowing through a power line PL provided with the current transformer CT. Further, according to Embodiment 1, the microcomputer section 23 carries out control so that any one of the plurality of switching circuits 20 is selected, the selected one of the plurality of switching circuits 20 causes an electric current from a corresponding current transformer CT of the current transformers CT1 through CT4 to flow to the sensing circuit 22, whereas the other (unselected) switching circuits 20 cause electric currents from respective current transformers CT of the current transformers CT1 through CT4 to flow to the power supply section 21, and the selection is carried out successively with respect to each of the plurality of switching circuits 20.

The arrangement makes it only necessary for the electric current measuring unit 11 to include one (1) sensing circuit 22 for sensing an electric current from a current transformer CT and one (1) microcomputer section for measuring an electric current flowing through a power line PL provided with a current transformer CT, and makes it unnecessary for the electric current measuring unit 11 to include a plurality of such sensing circuits 22 and a plurality of such microcomputer sections 23. This allows the electric current measuring unit 11 to be smaller in size.

The power supply section 21 stores electricity by use of the electric currents from the current transformers CT1 through CT4 provided to the respective plurality of power lines PL1 through PL4. In this case, assuming that a probability that a value of an electric current flowing through one (1) power line PL is not more than a threshold that allows the power supply section 21 to be charged is p (0<p<1), a probability that values of electric currents flowing through N power lines PL1 through PLN are all not more than the threshold is $p^N$, which is lower than the probability p in the case of the one power line PL. Assuming that an expected value of electric power obtained from one (1) power line PL is S, an expected value of electric power obtained from N power lines PL is N×S, which is higher than the expected value S in the case of the one power line PL.

Thus, it is expected that electricity is stored in a larger amount by use of the current transformers CT1 through CT4 provided to the respective plurality of power lines PL1 through PL4 than by use of a current transformer CT provided to one (1) power line PL. This allows the power supply section 21 to supply required electric power to each of the microcomputer section 23 and the wireless transmission section 24, and allows reliable operation of the electric current measuring unit 11.

The wireless transmission section 24 wirelessly transmits measured data to the receiving unit 12 by changing the measured data into a format suitable for wireless transmission, the measured data containing measured values of a plurality of electric currents measured by the microcomputer section 23. The wireless transmission is carried out by use of a wireless communication technique with lower electric power consumption, such as ZigBee (Registered Trademark) or Bluetooth (Registered Trademark). The wireless transmission section 24 includes, for example, a modulation and demodulation circuit, and an RF (Radio Frequency) circuit.

According to Embodiment 1, the wireless transmission section 24 collectively wirelessly transmits measured values of electric currents flowing through the plurality of power lines PL1 through PL4 and measured by the microcomputer section 23. This case, which further allows a reduced amount of electric power consumption than a case where the measured values are separately wirelessly transmitted, allows more reliable operation of the electric current measuring unit 11.

This is more specifically described below. A wireless transmission process carried out by the wireless transmission section 24 can be roughly divided into a start and end process, a connection and disconnection process, and a data transmission process. The data transmission process can be divided into a process for transmitting data different from a measured value, and a process for transmitting data of a measured value. Assume that an amount of electric power consumed (energy consumed) in the start and end process is E1, an amount of electric power consumed (energy consumed) in the connection and disconnection process is E2, an amount of electric power consumed (energy consumed) in the process for transmitting data different from a measured value is E31, and an amount of electric power consumed (energy consumed) in the process for transmitting data of a measured value is E32.

In a case where measured values of electric currents flowing through N power lines PL are separately transmitted, an amount of electric power consumption Es is expressed by the following equation: Es=(E1+E2+E31+E32)×N. Meanwhile, in a case where the measured values of the electric currents flowing through the N power lines PL are collectively transmitted, an amount of electric power consumption Eb is expressed by the following equation: Eb=E1+E2+E31+(E32×N). Thus, the equation Es−Eb=(E1+E2+E31)×(N−1) is derived. In a case where N is two or more, it can be understood that the case where the measured values are collectively wirelessly transmitted achieves a lower amount of electric power consumption than the case where the measured values are separately wirelessly transmitted.

(Details of Microcomputer Section)

Next, the microcomputer section 23 is specifically described below in detail. As illustrated in FIG. 1, the microcomputer section 23 includes a memory section 30, a switching instructing section (control section) 31, a measuring section (electric current measuring section) 32, and a data sending section 33. The memory section 30 corresponds to the memory, and carries out functions of the measuring section 32, the switching instructing section 31, and the data sending section 33 by causing the microprocessor to execute a program stored in the memory section 30.

The memory section 30 is constituted by, for example, a nonvolatile memory device such as a flash memory or Read Only Memory (ROM), and a volatile memory device such as Random Access Memory (RAM). Examples of contents stored in the nonvolatile memory device include, for example, a control program (described earlier), an operating system (OS) program, other various programs, and various set values. Examples of contents stored in the volatile memory device include, for example, a work file and a temporary file.

The switching instructing section 31 gives the switching circuit 20 a switching instruction to switch between the power supply section 21 and the sensing circuit 22 to either of which an electric current from a current transformer CT is to flow. This switching instruction is described later in detail.

The measuring section 32 measures, in accordance with the sensing signal from the sensing circuit 22, an electric current flowing through a power line PL provided with a corresponding current transformer CT. The measuring section 32 sends a measured value of the measured electric current to the data sending section 33. Examples of a physical quantity of an electric current to be measured include a peak value, a momentary value, a phase, an effective value, a frequency, and the like of the electric current, and the physical quantity is an effective value in Examples.

Specifically, first, a sensing signal indicative of an electric current flowing from a current transformer CT is sampled, and the sensing signal is fitted to a predetermined waveform (normally, a sine wave), so that an amplitude of the electric current is specified, and an effective value of the electric current is calculated from the amplitude of the electric current. Subsequently, from the calculated effective value of the electric current flowing from the current transformer CT, an effective value Ie of an electric current flowing through a power line PL provided with a corresponding current transformer CT is calculated by use of a turn ratio, stored in the memory section 30, between (a) the number of turns on the primary side of that current transformer CT and (b) the number of turns on the secondary side of that current transformer CT.

The data sending section 33 transmits, to the wireless transmission section 24, a measured value of an electric current which measured value is sent from the measuring section 32.

Next, the switching instruction given by the switching instructing section 31 is described below in detail. FIG. 3 is a time chart showing changes over time in (i) operation of switching among the switching circuits 20a through 20d for the respective current transformers CT1 through CT4 (hereinafter referred to as a switching circuit 20a for CT1 through a switching circuit 20d for CT4, respectively) and (ii) operation of the microcomputer section 23 and the wireless transmission section 24. According to an example shown in FIG. 3, the switching circuits 20 each normally cause an electric current from a current transformer CT to flow to the power supply section 21, and only in a case where the switching instruction is given by the microcomputer section 23, the switching circuits 20 each cause the electric current to flow to the sensing circuit 22.

Figure 3:
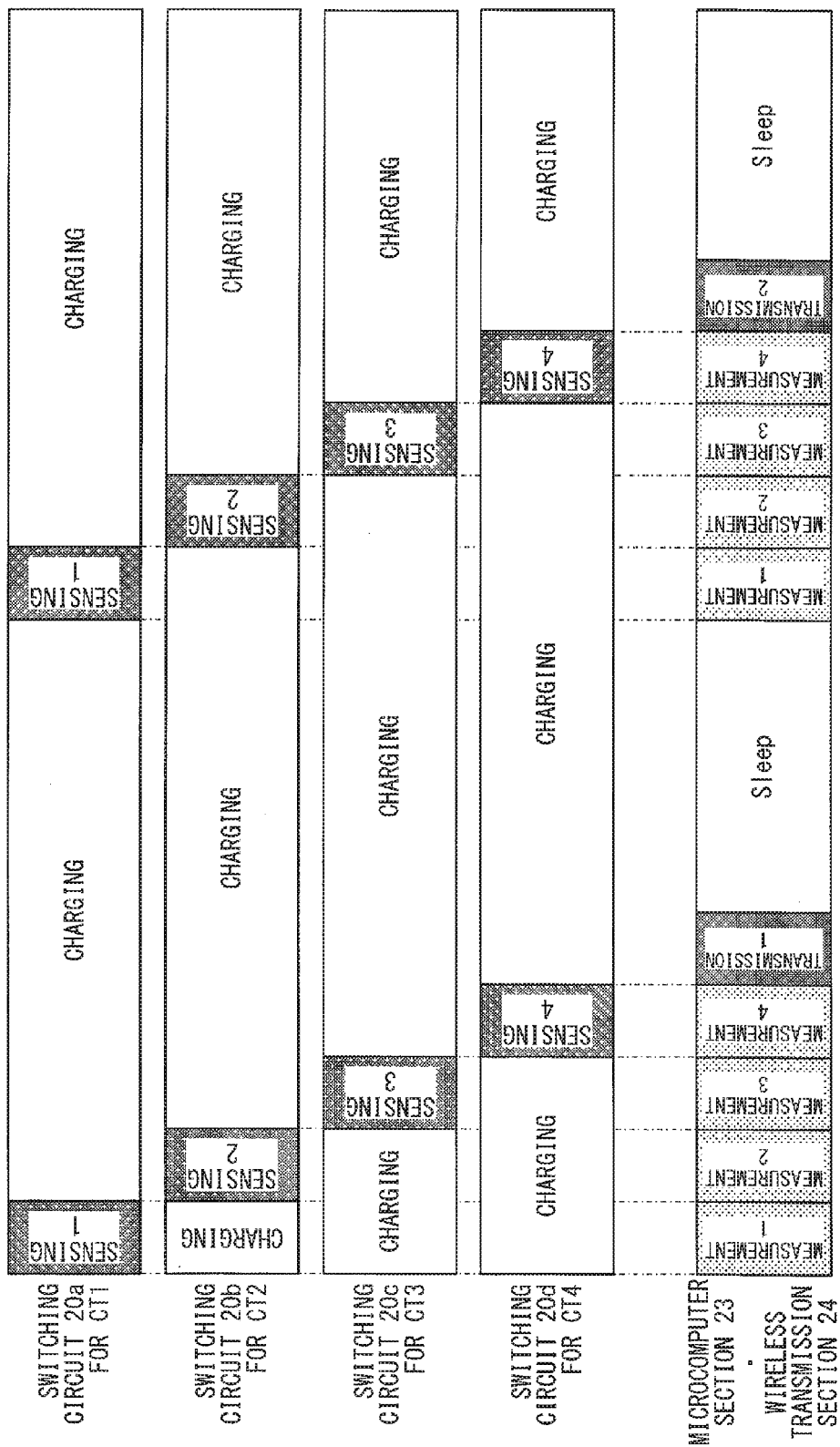
FIG. 3 is a time chart showing changes over time, which are obtained in the electric current measuring unit, in (i) operation of switching among switching circuits and (ii) operation of a microcomputer section and a wireless transmission section.

As illustrated in FIG. 3, first, the switching instructing section 31 of the microcomputer section 23 selects the switching circuit 20a for CT1, and gives the selected switching circuit 20a the switching instruction. This causes an electric current from the current transformer CT1 to flow via the switching circuit 20a to the sensing circuit 22, so that the electric current is measured by the sensing circuit 22 (sensing 1). As a result, an effective value I1e of an electric current flowing through the power line PL1 provided with the current transformer CT1 is measured by the microcomputer section 23 (measurement 1). Meanwhile, electric currents from the other current transformers CT2 through CT4 flow via the respective switching circuits 20b through 20d to the power supply section 21 so as to be stored in the power supply section 21 (charging).

Next, the switching instructing section 31 of the microcomputer section 23 selects the switching circuit 20b for CT2, and gives the selected switching circuit 20b the switching instruction. This causes an electric current from the current transformer CT2 to flow via the switching circuit 20b to the sensing circuit 22, so that the electric current is measured by the sensing circuit 22 (sensing 2). As a result, an effective value I2e of an electric current flowing through the power line PL2 provided with the current transformer CT2 is measured by the microcomputer section 23 (measurement 2). Meanwhile, electric currents from the other current transformers CT1, CT3, and CT4 flow via the respective switching circuits 20a, 20c, and 20d to the power supply section 21 so as to be stored in the power supply section 21 (charging).

The switching circuit 20c for CT3 and the switching circuit 20d for CT4 are each selected as in the case of the switching circuits 20a for CT1 and 20b for CT2. The effective values I1e through I4e of the electric currents flowing through the power lines PL1 through PL4 provided with the respective current transformers CT1 through CT4 are thus measured (measurement 1 through measurement 4).

Subsequently, the wireless transmission section 24 is started and collectively wirelessly transmits the effective values I1e through I4e of the electric currents measured by the microcomputer section 23 (transmission 1). In this case, since the switching instructing section 31 has given none of the switching circuits 20 the switching instruction, electric currents from all the current transformers CT1 through CT4 flow via the respective switching circuits 20a through 20d to the power supply section 21 so as to be stored in the power supply section 21 (charging).

Then, the microcomputer section 23 and the wireless transmission section 24 stop the operation until a predetermined period elapses (sleep mode). This allows lower electric power consumption. Further, the electric currents from all the current transformers CT1 through CT4 flow via the respective switching circuits 20a through 20d to the power supply section 21 so as to be stored in the power supply section 21 (charging). Thereafter, the operation described earlier is repeated.

According to Embodiment 1, an effective value of an electric current is measured. Note, however, that it is possible to measure any physical quantity concerning an electric current, such as a peak value, a momentary value, a phase, or a frequency. Note also that it is possible to use, as a waveform to which the sensing signal is to be fitted, any waveform such as a saw-tooth wave or a triangular wave as well as a sine wave.

(Details of Receiving Unit)

Next, the receiving unit 12 is specifically described below in detail. As illustrated in FIG. 2, the receiving unit 12 includes a receiving section 40, a logger section 42, a recording section 43, and a display section 44. Note that the receiving unit 12 is externally supplied with electric power.

The receiving section 40 receives measured data wirelessly transmitted from the electric current measuring unit 11, and includes, for example, a modulation and demodulation circuit and an RF circuit. The receiving section 40 sends the received data to the logger section 42.

The operation section 41 receives various inputs from a user in response to a user operation, and is constituted by an input button and the other operation devices. The operation section 41 converts, into operation data, information operated by the user, and sends the operation data to the logger section 42. Note that examples of the other operation devices include a touch panel, a keyboard, a numeric keypad, and a pointing device such as a mouse.

The logger section 42 writes, on a time-series basis, the measured data from the receiving section 40 into the recording section 43. Note that the logger section 42 desirably writes, into the recording section 43, the measured data together with a measurement time. The measurement time, together with the measured data, can be received from the electric current measuring unit 11, and a time at which the measured data was received can be regarded as the measurement time.

The logger section 42 causes the display section 44 to display and output measured values (the effective values I1e through I4e of the electric currents) indicated by the measured data from the receiving section 40. Further, it is desirable that the logger section 42 read the measured data from the recording section 43 in accordance with an instruction from the user via the operation section 41, and cause the display section 44 to display and output the measured data.

The recording section 43 records therein the measured data from the logger section 42, and is constituted by, for example, a nonvolatile random access memory such as Electrically Erasable Programmable ROM (EEPROM, Registered Trademark) or a flash memory. Note that the recording section 43 is desirably a removable recording medium so that the measured data recorded therein can be used in, for example, an external personal computer (PC).

The display section 44 displays the measured data from the logger section 42. The display section 44 is constituted by a display element such as a segment display element or a bitmap display element.

Note that the receiving unit 12 desirably includes a network interface (IF) that is connectable to a local area network (LAN). In this case, the measured data recorded in the recording section 43 can be transmitted via the LAN to an external information processing device.

Embodiment 2

Next, another embodiment of the present invention is described below with reference to FIGS. 4 through 6. An electric current measuring system 10 of Embodiment 2 is different from the electric current measuring system 10 illustrated in FIG. 2 in arrangement and operation of an electric current measuring unit 11. The electric current measuring system 10 of Embodiment 2 and the electric current measuring system 10 illustrated in FIG. 2 are identical in the other arrangements.

Figure 4:
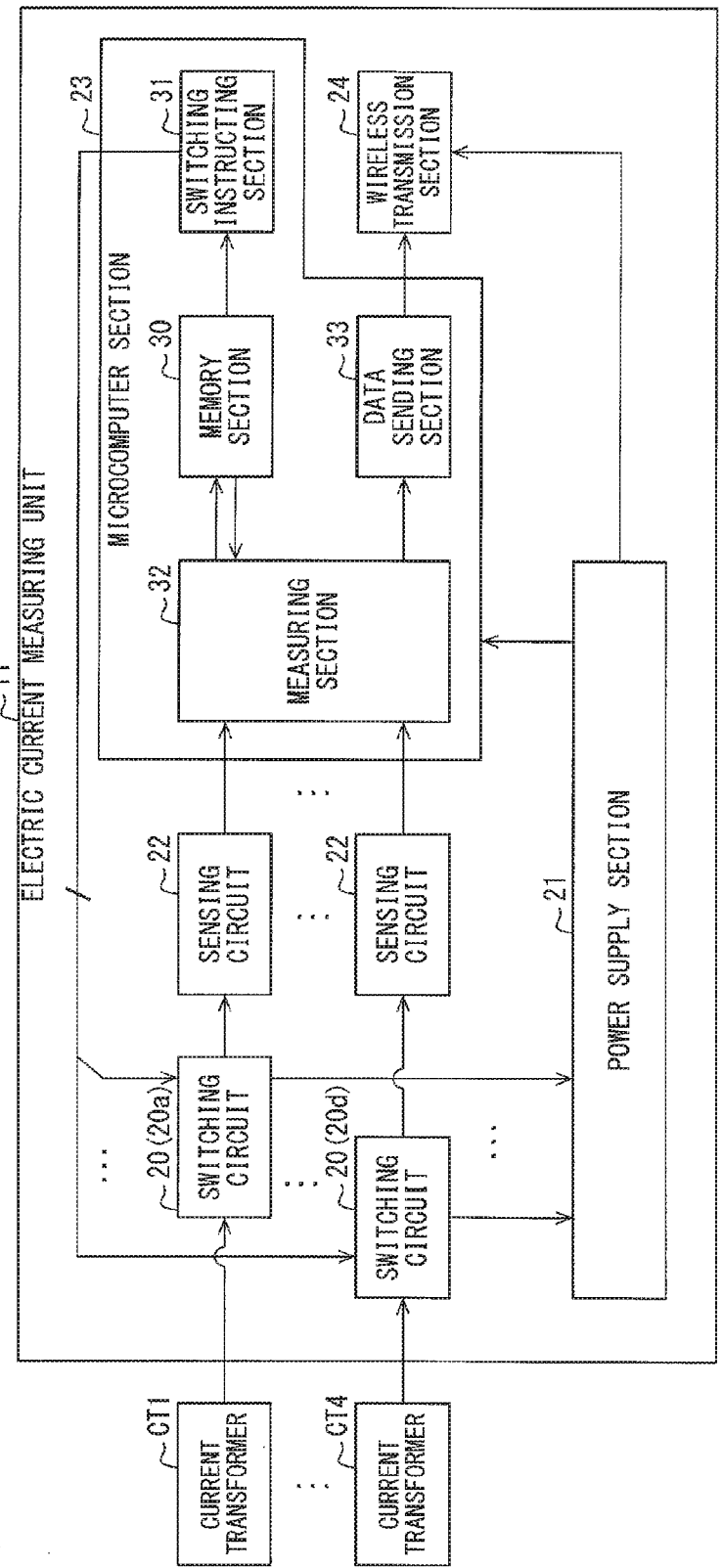
FIG. 4 is a block diagram schematically illustrating an arrangement of an electric current measuring unit of an electric current measuring system of another embodiment of the present invention.

FIG. 4 is a block diagram schematically illustrating an arrangement of the electric current measuring unit 11 of Embodiment 2. The electric current measuring unit 11 illustrated in FIG. 4 is different from the electric current measuring unit 11 illustrated in FIG. 1 in (i) that the electric current measuring unit 11 illustrated in FIG. 4 includes sensing circuits 22 that are provided to respective switching circuits 20 and (ii) operation of a microcomputer section 23. The electric current measuring unit 11 illustrated in FIG. 4 and the electric current measuring unit 11 illustrated in FIG. 1 are identical in the other arrangements. As in Embodiment 2, the sensing circuits 22 can be provided to the respective switching circuits 20.

Figure 5:
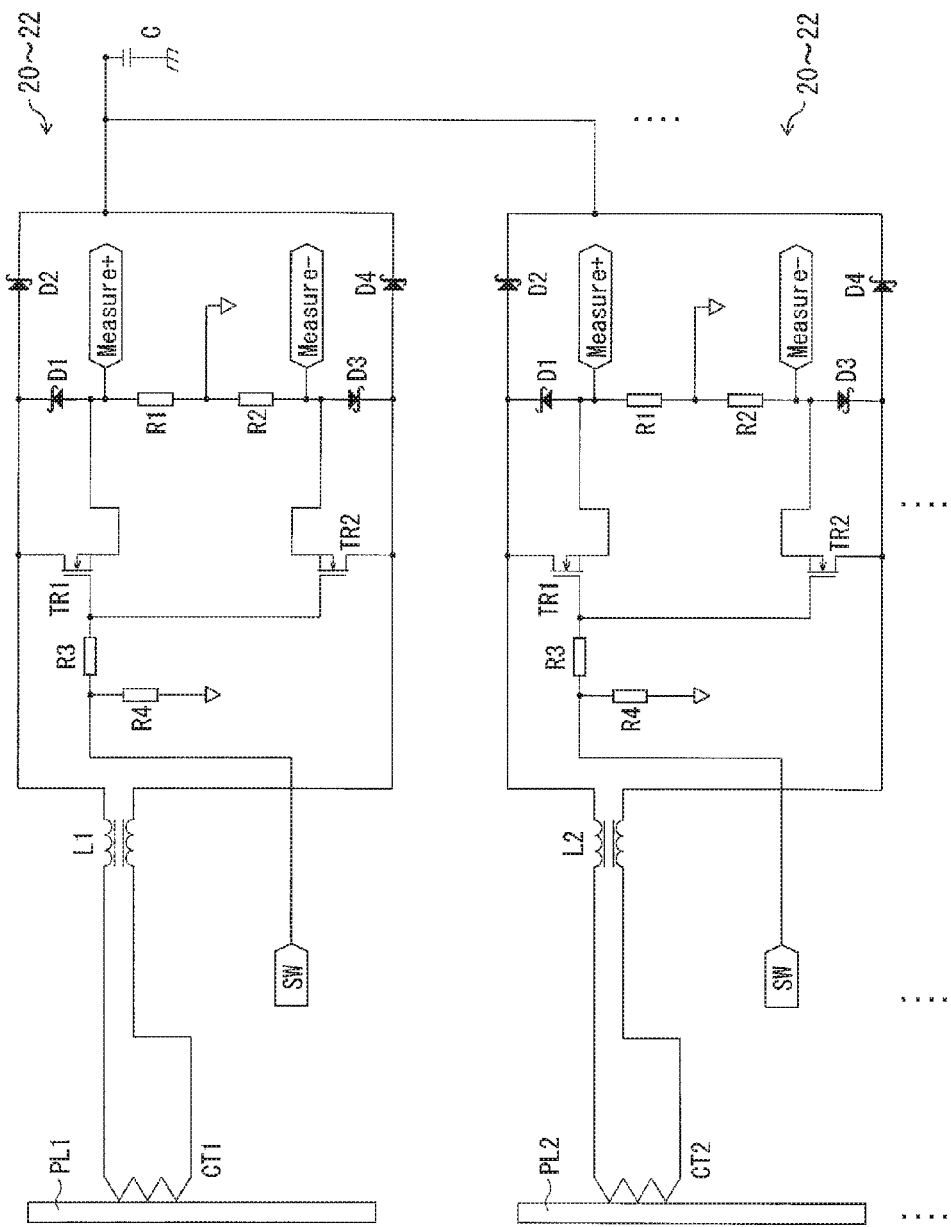
FIG. 5 is a circuit diagram specifically illustrating a switching circuit, a power supply section, and a sensing circuit of the electric current measuring unit.

FIG. 5 is a circuit diagram specifically illustrating a switching circuit 20, a power supply section 21, and a sensing circuit 22 of the electric current measuring unit 11. In FIG. 5, the switching circuit 20 is constituted by a coil L1 for noise removal, resistances R3 and R4 for switching, and switching elements TR1 and TR2, each of which is a thin film transistor (TFT), the power supply section 21 is constituted by rectifier circuits D1 through D4, which constitute a diode bridge, and a capacitor C for storing electricity, and the sensing circuit 22 is constituted by resistances R1 and R2 for sensing. Note that the members different from the capacitor C for storing electricity are provided for each of the current transformers CT1 through CT4.

In a case where the switching circuit 20 receives no switching instruction SW from a switching instructing section 31 of a microcomputer section 23, the switching elements TR1 and TR2 turn off, an electric current from a current transformer CT, from which electric current a high-frequency noise is removed by the coil L1 for noise removal, is rectified by the rectifier circuits D1 through D4, and then electricity is stored in the capacitor C for storing electricity. Meanwhile, in a case where the switching circuit 20 receives the switching instruction SW from the switching instructing section 31, the switching elements TR1 and TR2 turn on, the electric current from the current transformer CT, from which electric current a high-frequency noise is removed by the coil L1 for noise removal, is converted into voltages by the resistances R1 and R2 for sensing. Then, the voltages at both ends of the resistances R1 and R2 for sensing are (i) outputted via respective output terminals Mesure+ and Mesure– for sensing, which output terminals are provided at the respective both ends, (ii) amplified by a differential amplifier circuit, and (iii) supplied to the microcomputer section 23.

Figure 2:
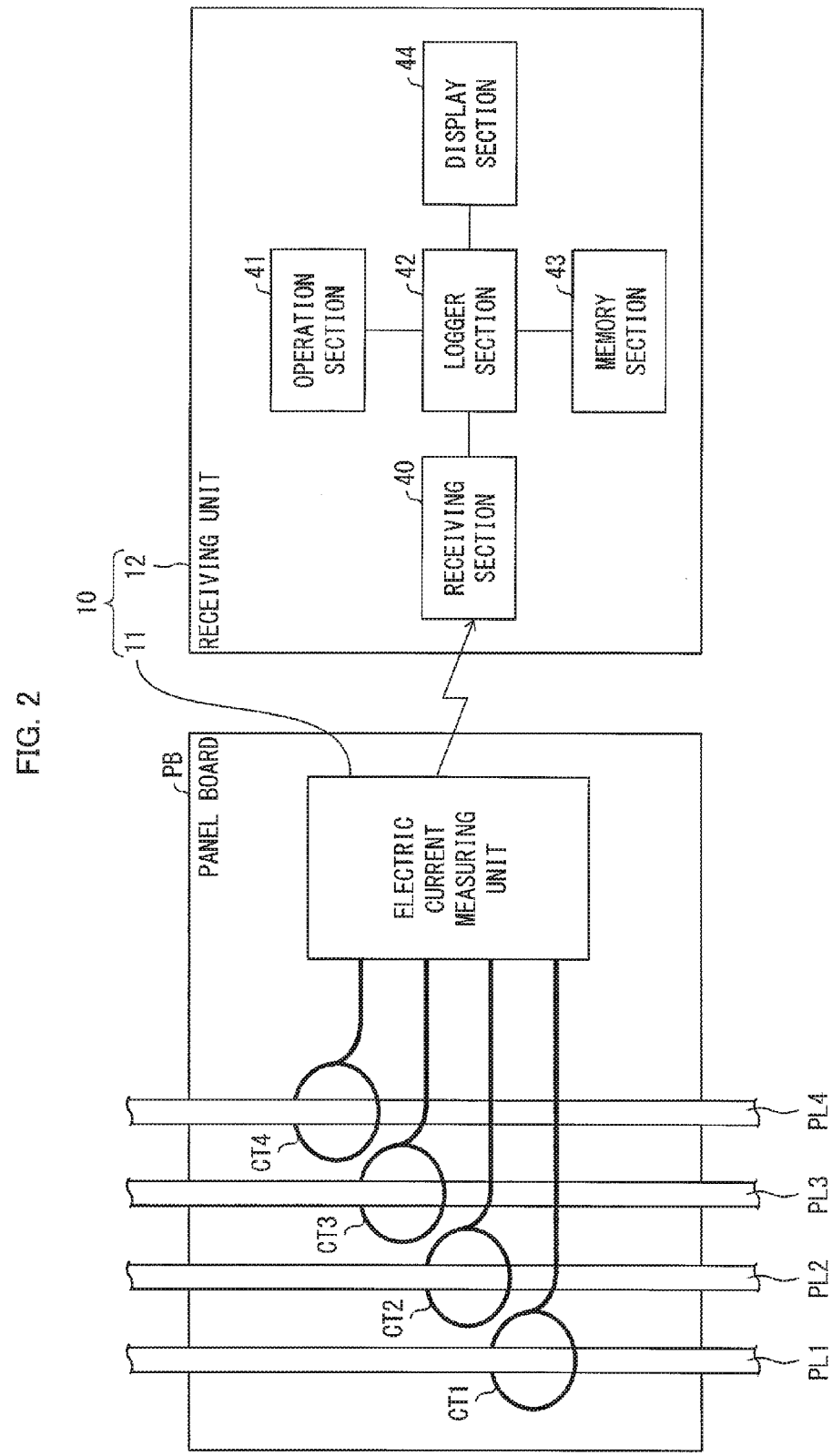
FIG. 2 is a block diagram schematically illustrating an arrangement of an electric current measuring system.

The microcomputer section 23 of Embodiment 2 is different from the microcomputer section 23 illustrated in FIG. 1 in operation of a memory section 30, the switching instructing section 31, and a measuring section 32. The microcomputer section 23 of Embodiment 2 and the microcomputer section 23 illustrated in FIG. 1 are identical in the other arrangements.

The measuring section 32 and the memory section 30 of Embodiment 2 are different from the measuring section and the memory section 30, respectively, each illustrated in FIG. 1, in that the memory section 30 of Embodiment 2 further stores therein measured values (effective values I1e through I4e) of electric currents together with numbers of respective current transformers CT. The measuring section 32 and the memory section 30 of Embodiment 2 are identical in the other arrangements to the measuring section 32 and the memory section 30, respectively, each illustrated in FIG. 1. FIG. 6 is a view illustrating, in a form of a table, a correspondence table of a measured value of an electric current and a number of a current transformer CT, the measured value and the number each being stored in the memory section 30.

The switching instructing section 31 of Embodiment 2 is different from the switching instructing section 31 illustrated in FIG. 1 in operation of a switching instruction. The switching instructing section 31 of Embodiment 2 and the switching instructing section 31 illustrated in FIG. 1 are identical in the other arrangements. The switching instructing section 31 of Embodiment 2 selects, with reference to the correspondence table stored in the memory section 30, a switching circuit 20 in ascending order of measured values sensed last time. In the case of an example of FIG. 6, the switching instructing section 31 selects a switching circuit 20d for CT4, a switching circuit 20b for CT2, a switching circuit 20a for CT1, and a switching circuit 20c for CT3 in this order.

Normally, a power line PL which is low in effective value Ie of an electric current measured last time is expected to be also low in effective value Ie of the electric current measured this time. Similarly, a power line PL which is high in effective value Ie of an electric current measured last time is expected to be also high in effective value Ie of the electric current measured this time.

Thus, according to the arrangement, an electric current from a current transformer CT (in the example of FIG. 6, CT4) provided to a power line PL which is expected to be low in effective value Ie of an electric current flows via a switching circuit 20 to a sensing circuit 22, whereas electric currents from current transformers CT (in the example of FIG. 6, CT1 through CT3) provided to respective power lines PL each of which is expected to be high in effective value Ie of an electric current flow to the power supply section 21. With this, electricity is expected to be rapidly stored in the power supply section 21. This allows reliable supply of required electric power from the power supply section 21 to each of the microcomputer section 23 and the wireless transmission section 24, and allows more reliable operation of the electric current measuring unit 11.

Embodiment 3

Next, still another embodiment of the present invention is described below with reference to FIGS. 7 and 8. An electric current measuring system 10 of Embodiment 3 is different from the electric current measuring system 10 illustrated in FIG. 2 in operation of a microcomputer section 23 and a wireless transmission section 24 of an electric current measuring unit 11. The electric current measuring system 10 of Embodiment 3 and the electric current measuring system 10 illustrated in FIG. 2 are identical in the other operation.

The electric current measuring unit 11 of Embodiment 3 is different from the electric current measuring unit 11 illustrated in each of FIG. 4 and FIG. 5 in that operation of the microcomputer section 23 and the wireless transmission section 24 is controlled in accordance with a voltage (output voltage) Vc of the capacitor C for storing electricity of the power supply section 21 (FIG. 5). The electric current measuring unit 11 of Embodiment 3 and the electric current measuring unit 11 illustrated in each of FIG. 4 and FIG. 5 are identical in the other operation.

Figure 7:
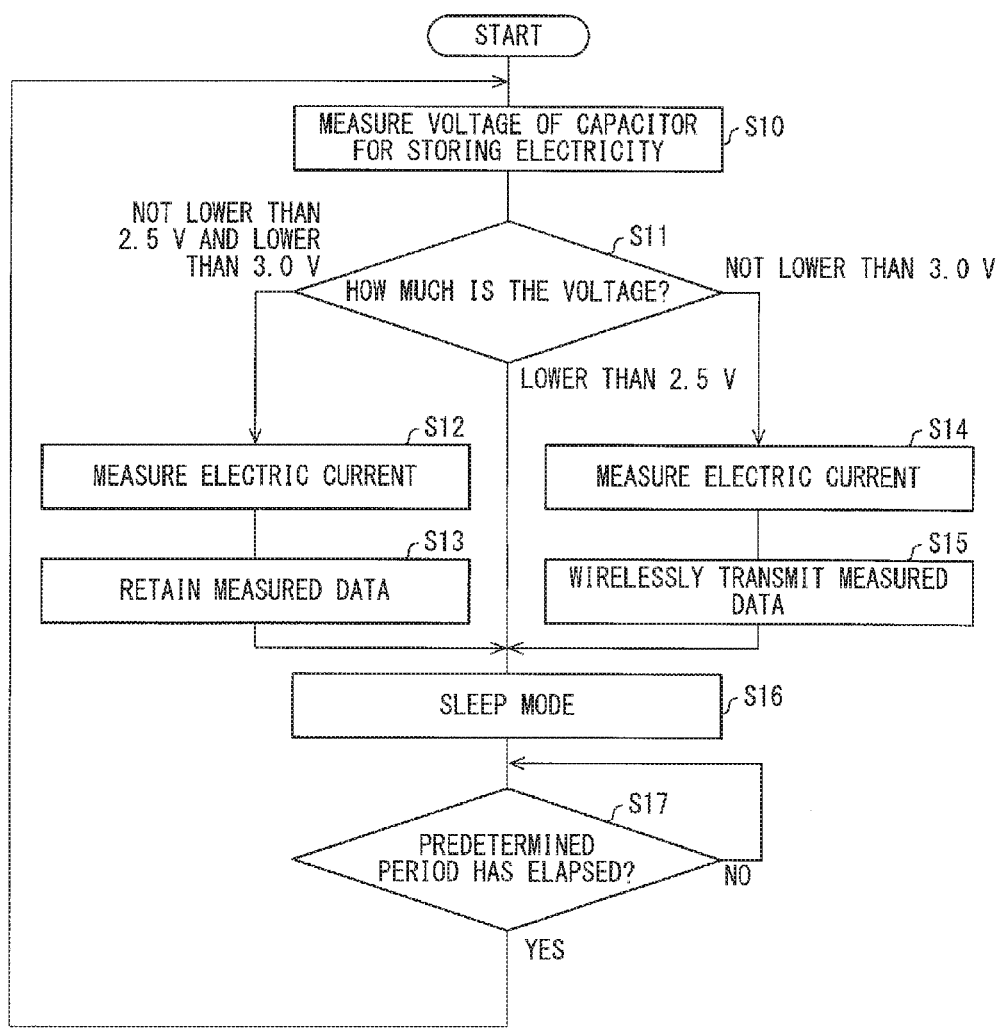
FIG. 7 is a flowchart showing how an operation control process is carried out by a microcomputer section of an electric current measuring unit of an electric current measuring system of still another embodiment of the present invention.

FIG. 7 is a flowchart showing how an operation control process is carried out by the microcomputer section 23 of Embodiment 3. As illustrated in FIG. 7, first, the voltage Vc of the capacitor C for storing electricity is measured (S10). In a case where the voltage Vc is lower than 2.5 V (a first predetermined value) (S11), neither measurement of an electric current by the microcomputer section 23 nor wireless transmission by the wireless transmission section 24 is carried out, and the process proceeds to a sleep mode (S16).

With the arrangement, it is possible to prevent (i) a shortage of electric power supplied from the capacitor C for storing electricity and (ii) an inoperative state of the microcomputer section 23 and the wireless transmission section 24, the shortage and the inoperative state each being caused by carrying out (a) measurement of an electric current by the microcomputer section 23 and (b) wireless transmission by the wireless transmission section 24. Further, since a switching instruction given by a switching instructing section 31 of the microcomputer section 23 is also stopped, all electric currents from a plurality of current transformers CT1 through CT4 flow to the capacitor C for storing electricity. Thus, electricity is rapidly stored in the capacitor C for storing electricity. This makes it possible to shorten a period before the microcomputer section 23 and the wireless transmission section 24 each resume operation.

Meanwhile, in a case where the voltage Vc is not lower than 2.5 V and is lower than 3.0 V (a second predetermined value) (S11), measurement of an electric current by the microcomputer section 23 is carried out (S12), but wireless transmission by the wireless transmission section 24 is not carried out, and measured data is retained (S13). Thereafter, the process proceeds to the sleep mode (S16).

With the arrangement, it is possible to prevent (i) a shortage of electric power supplied from the capacitor C for storing electricity and (ii) an inoperative state of the microcomputer section 23 and the wireless transmission section 24, the shortage and the inoperative state each being caused by carrying out wireless transmission by the wireless transmission section 24. Note that the measured data can be retained in a memory section 30 of the microcomputer section 23, or can be stored in a memory section (not illustrated) of the wireless transmission section 24. Further, it is desirable to attach, for example, time information, a sequence number, and/or an unsent flag to the measured data so as to prevent the measured data from being confused with measured data to be measured later.

Meanwhile, in a case where the voltage Vc is not lower than 3.0 V (S11), measurement of an electric current by the microcomputer section 23 is carried out (S14), and wireless transmission of measured data by the wireless transmission section 24 is carried out (S15). In this case, wireless transmission of unsent measured data by the wireless transmission section 24 is also carried out. Thereafter, the process proceeds to the sleep mode (S16).

In a case where a predetermined period has elapsed (S17) after the process proceeded to the sleep mode (S16), the process returns to S10, and the operation described earlier is repeated.

Figure 8:
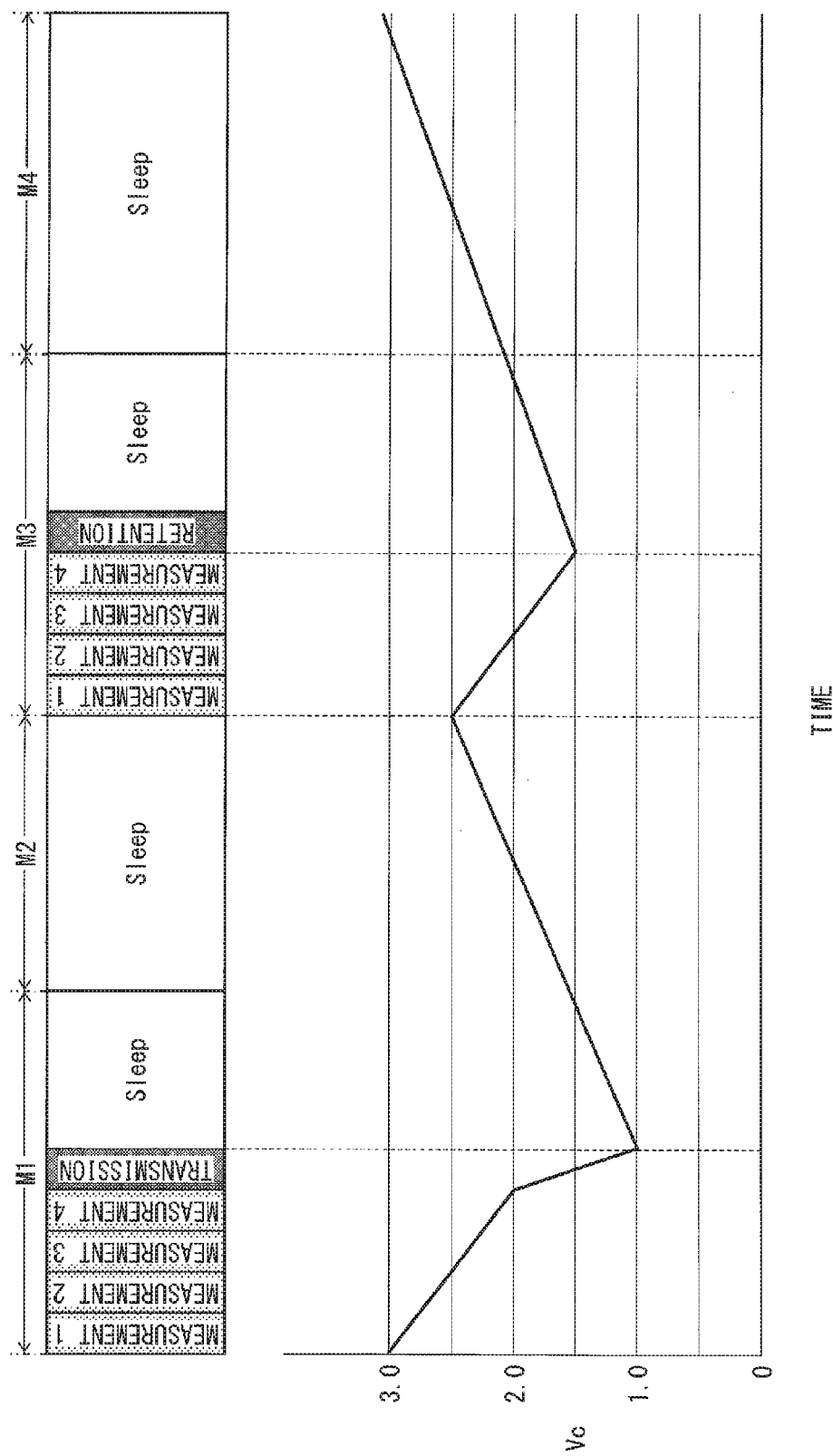
FIG. 8 is a time chart showing changes over time, which are obtained in the electric current measuring unit, in (i) operation of a microcomputer section and a wireless transmission section and (ii) voltage of a capacitor for storing electricity.

FIG. 8 is a time chart showing changes over time, which are obtained in Embodiment 3, in (i) operation of the microcomputer section 23 and the wireless transmission section 24 and (ii) voltage of the capacitor C for storing electricity. As illustrated in FIG. 8, in a case where the first measuring period (M1) is started, since the voltage Vc is 3 V, the microcomputer section 23 carries out measurement of electric currents (measurement 1 through measurement 4), the wireless transmission section 24 carries out wireless transmission of measured data (transmission), and then the process proceeds to the sleep mode (Sleep). Subsequently, in a case where the second measuring period (M2) is started, since the voltage Vc is approximately 1.5 V, the microcomputer section 23 does not carry out measurement of an electric current, the wireless transmission section 24 does not carry out wireless transmission of measured data, and the process proceeds to the sleep mode (Sleep).

Then, in a case where the third measuring period (M3) is started, since the voltage Vc is 2.5 V, the microcomputer section 23 carries out measurement of electric currents (measurement 1 through measurement 4), whereas the wireless transmission section 24 does not carry out wireless transmission of measured data (transmission), and the measured data is retained (retention). Thereafter, the process proceeds to the sleep mode (Sleep). Next, in a case where the fourth measuring period (M4) is started, since the voltage Vc is approximately 2 V, the microcomputer section 23 does not carry out measurement of an electric current, the wireless transmission section 24 does not carry out wireless transmission of measured data, and the process proceeds to the sleep mode (Sleep).

Subsequently, in a case where the fifth measuring period is started, since the voltage Vc is approximately 3 V, operation similar to that carried out in the first measuring period is carried out. In this case, the wireless transmission section 24 collectively transmits the measured data measured in the third measuring period and measured data measured in this period (fifth measuring period).

Embodiment 4

Next, a further embodiment of the present invention is described below with reference to FIG. 9. An electric current measuring system 10 of Embodiment 4 is different from the electric current measuring system 10 illustrated in FIG. 2 in operation of a microcomputer section 23 of an electric current measuring unit 11. The electric current measuring system 10 of Embodiment 4 and the electric current measuring system 10 illustrated in FIG. 2 are identical in the other operation.

The microcomputer section 23 of Embodiment 4 is different from the microcomputer section 23 illustrated in FIG. 4 in that in a case where a difference between a measured value of a measured electric current and a measured value wirelessly transmitted last time falls within a predetermined range and a time having elapsed since the wireless transmission was carried out last time falls within a predetermined period, wireless transmission of the measured value of the measured electric current is omitted. The microcomputer section 23 of Embodiment 4 and the microcomputer section 23 illustrated in FIG. 4 are identical in the other arrangements.

With the arrangement, in a case where the measured value of the electric current does not change so much, wireless transmission of the measured value is omitted. Such a case allows a lower amount of electric power consumption than a case where measured values of all electric currents are wirelessly transmitted. This allows more reliable operation of the electric current measuring unit 11. Further, even in a case where wireless transmission of the measured value is continuously omitted, wireless transmission of the measured value is carried out after a predetermined period has elapsed. This allows a receiving unit 12 to determine whether a measured value of an electric current flowing through a power line PL does not change so much, or whether the measured value is too low to measure.

Figure 9:
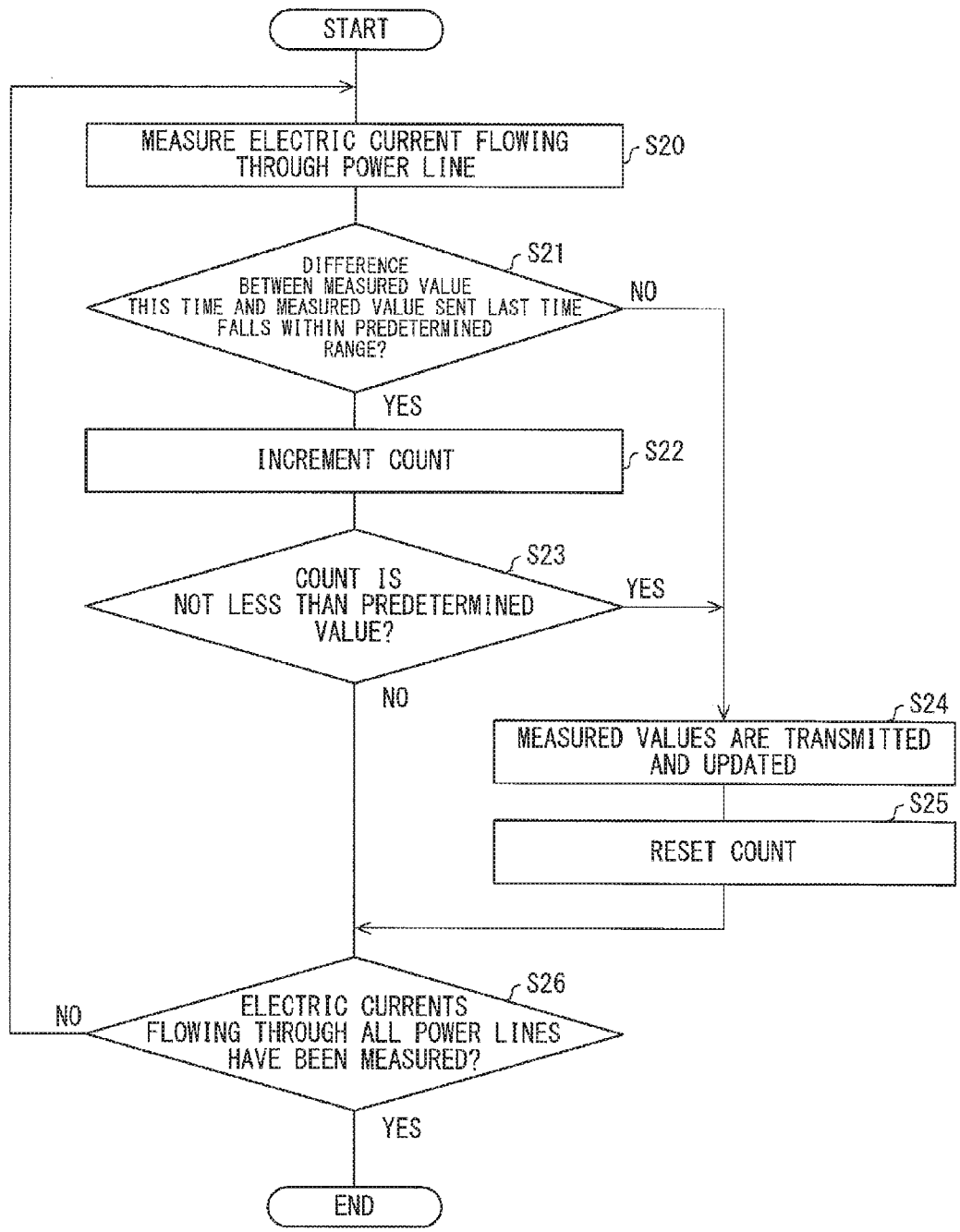
FIG. 9 is a flowchart showing how an electric current measuring process is carried out by a microcomputer section of an electric current measuring unit of an electric current measuring system of a further embodiment of the present invention.

FIG. 9 is a flowchart showing how an electric current measuring process is carried out by the microcomputer section of Embodiment 4. As illustrated in FIG. 9, a measuring section 32 measures an electric current flowing through a power line PL (S20), and determines whether a difference between a measured value this time and a measured value sent last time falls within a predetermined range (S21). In a case where the difference falls within the predetermined range, a count of a counter (not illustrated) is incremented (S22), and it is determined whether the count is not less than a predetermined value (S23).

In a case where the difference does not fall within the predetermined range (NO at S21), or in a case where the count is not less than the predetermined value (YES at S23), a data sending section 33 sends the measured value this time to a wireless transmission section 24, and updates a measured value stored in a memory section 30 (S24). The measured value this time is thus wirelessly transmitted. Next, the count of the counter is reset (S25), and the process proceeds to step S26.

Meanwhile, in a case where the difference falls within the predetermined range and the count is less than the predetermined value (NO at S23), the process directly proceeds to the step S26. Wireless transmission of the measured value this time is thus omitted.

In a case where electric currents flowing through all power lines PL have not been measured at the step S26, the process returns to step S20, and the operation described earlier is repeated. Meanwhile, in a case where the electric currents flowing through all the power lines PL have been measured at the step S26, measurement in a measuring period this time is ended.

Embodiment 5

Next, a further embodiment of the present invention is described below with reference to FIG. 10. An electric current measuring system 10 of Embodiment 5 is different from the electric current measuring system 10 illustrated in FIG. 2 in operation of a microcomputer section 23 of an electric current measuring unit 11. The electric current measuring system 10 of Embodiment 5 and the electric current measuring system 10 illustrated in FIG. 2 are identical in the other operation.

The microcomputer section 23 of Embodiment 5 is different from the microcomputer section 23 illustrated in FIG. 4 in that the microcomputer section 23 of Embodiment 5 determines, with reference to the correspondence table illustrated in FIG. 6, a frequency with which to measure an electric current flowing through each power line PL. The microcomputer section 23 of Embodiment 5 and the microcomputer section 23 illustrated in FIG. 4 are identical in the other arrangements.

Figure 10:
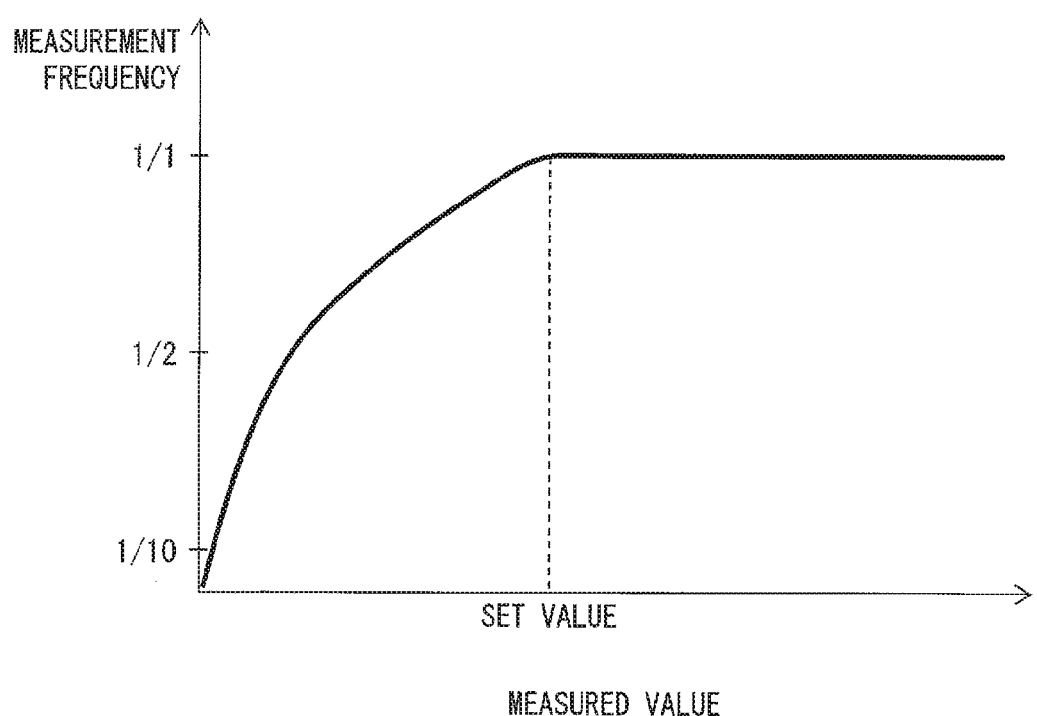
FIG. 10 is a graph showing a correspondence relationship between an effective value of an electric current and a measurement frequency in an electric current measuring system of a further embodiment of the present invention.

FIG. 10 is a graph showing a correspondence relationship between an effective value (measured value) of an electric current and a measurement frequency. As illustrated in FIG. 10, the measurement frequency is increased as the effective value of the electric current increases, and the effective value which is not less than a set value is measured every time. For example, in a case where the effective value of the electric current is ⅕ of the set value, the measurement frequency is ½, and measurement is carried out once in two measuring periods. This causes the measurement frequency to be in accordance with an amount of an electric current flowing into a power supply section 21. As a result, the electric current measuring unit 11 can more reliably operate.

Embodiment 6

Next, a further embodiment of the present invention is described below with reference to FIG. 11. An electric current measuring system 10 of Embodiment 6 is different from the electric current measuring system 10 illustrated in FIG. 2 in arrangement of a power supply section 21 of an electric current measuring unit 11 and operation of a microcomputer section 23. The electric current measuring system 10 of Embodiment 6 and the electric current measuring system 10 illustrated in FIG. 2 are identical in the other arrangements and operation.

Figure 11:
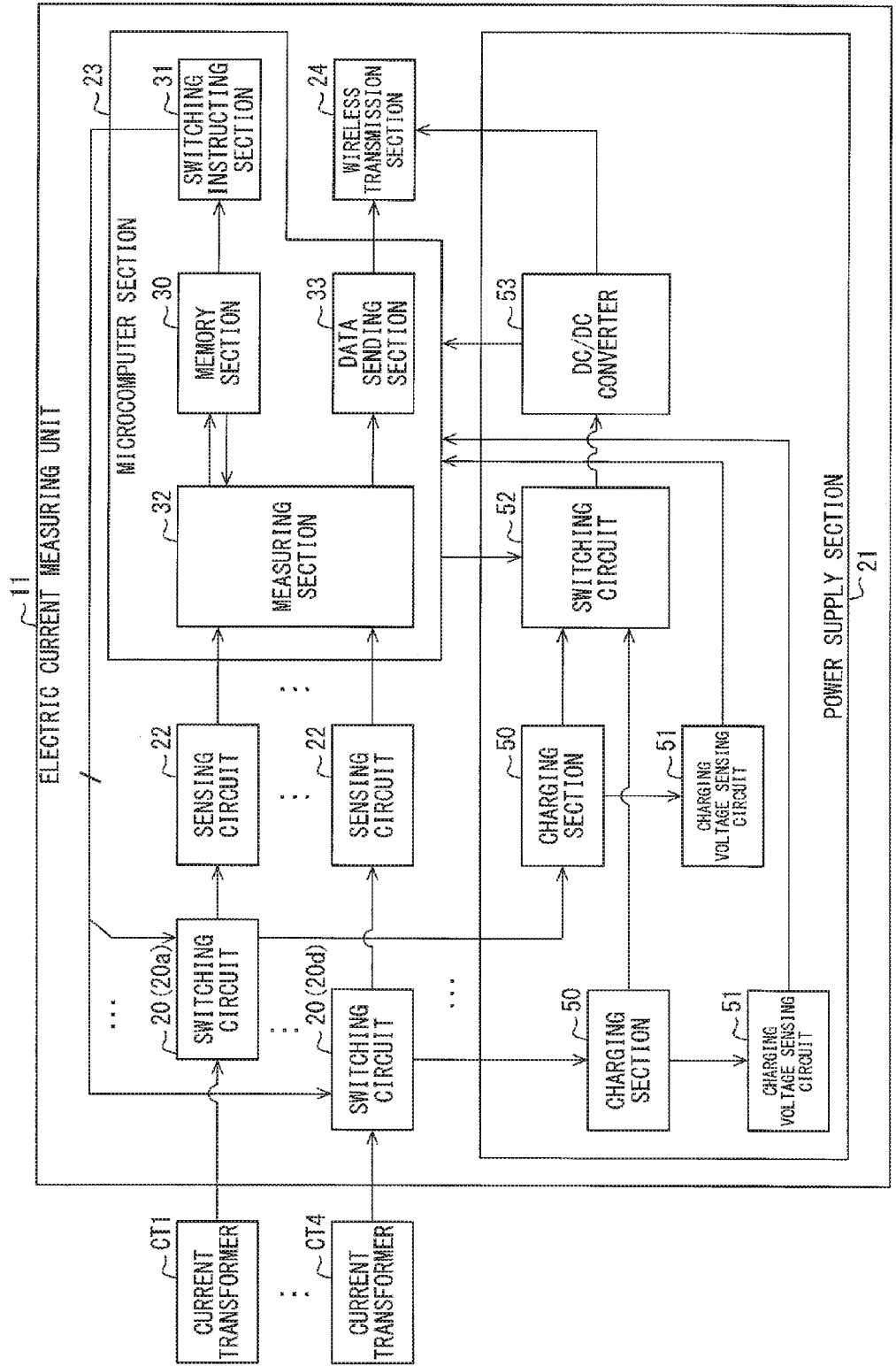
FIG. 11 is a block diagram schematically illustrating an arrangement of an electric current measuring unit of an electric current measuring system of a further embodiment of the present invention.

FIG. 11 is a block diagram schematically illustrating an arrangement of the electric current measuring unit 11 of Embodiment 6. As illustrated in FIG. 11, the power supply section 21 includes a plurality of charging sections 50, a plurality of charging voltage sensing circuits (voltage measuring sections) 51, a switching circuit 52, and a DC/DC converter 53.

The plurality of charging sections 50 is charged with electric currents from a respective plurality of switching circuits 20. Each of the plurality of charging sections 50 includes a capacitor or a secondary battery. The plurality of charging voltage sensing circuits 51 measures charging voltages (output voltages) of the respective plurality of charging sections 50. The plurality of charging voltage sensing circuits 51 sends the sensed charging voltages to the microcomputer section 23.

The switching circuit 52 switches, in accordance with an instruction from the microcomputer section 23, among the plurality of charging sections 50 from any of which electric power is to be supplied to the DC/DC converter 53. The DC/DC converter 53 converts a direct current voltage from the switching circuit 52 to a driving voltage of each of the microcomputer section 23 and a wireless transmission section 24, and applies the driving voltage to each of the microcomputer section 23 and the wireless transmission section 24.

According to Embodiment 6, the microcomputer section 23 obtains a charging voltage from a charging voltage sensing circuit 51. Examples of a case where the obtained charging voltage is zero or not more than a predetermined value may include a case where no current transformer CT is connected to a switching circuit 20 corresponding to the charging voltage sensing circuit 51, a case where a current transformer CT is connected to the switching circuit 20 but the current transformer CT is not provided to a power line PL, or a case where a current transformer CT is connected to the switching circuit 20 and the current transformer CT is provided to a power line PL, but no electric current flows through the power line PL. In any of these cases, it is unnecessary to carry out measurement based on an electric current from the switching circuit 20.

Thus, according to Embodiment 6, a switching instructing section 31 gives the switching circuit 20 no switching instruction in the above cases. This prevents the above measurement from being carried out, so that (i) wasteful electric power consumption caused by the measurement and (ii) a measuring time required for the measurement can be eliminated. As a result, the electric current measuring unit 11 can more reliably operate.

According to Embodiment 6, the microcomputer section 23 selects, in accordance with the charging voltages from the plurality of charging voltage sensing circuits 51, a charging section 50 from which to supply electric power, and gives the switching circuit 52 an instruction so that electric power is supplied from the selected charging section 50 to the DC/DC converter 53. This allows electric power for operating each section of the electric current measuring unit 11 to be secured without fail.

According to Embodiment 6, the switching instructing section 31 determines, in accordance with the charging voltages from the plurality of charging voltage sensing circuits 51, whether or not the switching instructing section 31 will give a switching instruction. Note, however, that it is also possible to determine, in accordance with whether a current transformer CT is connected to a switching circuit 20, whether or not the switching instructing section 31 will give the switching instruction. Further, according to Embodiment 6, in order to carry out such an operation control process as illustrated in FIG. 7, it is only necessary to calculate, at step S10 of FIG. 7, a total value of the charging voltages from the plurality of charging voltage sensing circuits 51, instead of measuring a voltage Vc of a capacitor C for storing electricity.

[Modification 1]

According to the above embodiments, the microcomputer section 23 of the electric current measuring unit 11 determines a timing at which to measure an electric current and a timing at which to wirelessly transmit measured data. Note, however, that it is also possible for the receiving unit 12 to determine those timings and transmit the timings to the electric current measuring unit 11. The receiving unit 12, which stores a log of the measured data and is externally supplied with electric power, is capable of specifically analyzing the measured data and determining the timings in accordance with a result of the analysis. As a result, the electric current measuring system 10 can more reliably operate.

[Modification 2]

According to the above embodiments, the current transformers CT1 through CT4 are provided to the respective plurality of power lines PL1 through PL4, which are similar. Note, however, that any one of the current transformers CT can be provided to a master line. In this case, a higher amount of electricity can be stored in the power supply section 21, and the electric current measuring system 10 can more reliably operate.

[Modification 3]

The receiving unit 12 can estimate, by analyzing (i) a state of electric power consumption by a power line PL and (ii) operation programs of programmable logic controllers (PLCs) connected to various electrical appliances, an electrical appliance connected to the power line PL.

Further, by using a so-called "device separation technique", the receiving unit 12 can estimate, from a change over time in measured value of a measured electric current flowing through each power line PL, (i) an electrical appliance connected to the each power line PL and (ii) a change over time in electric power consumption by the estimated electrical appliance.

[Modification 4]

In addition, by setting an effective value of a voltage and a power factor, the receiving unit 12 can calculate, from an effective value of an electric current from the electric current measuring unit 11, an approximate value of electric power to be supplied via each power line PL. Meanwhile, as described in Patent Literature 2, the electric current measuring unit (voltage measuring section, electric power measuring section, electric power measuring device) 11 can measure, by measuring a voltage of a power line PL, electric power to be supplied via each power line PL, and wirelessly transmit the measured electric power, the measured voltage, and the measured electric power to the receiving unit 12. That is, the present invention is also applicable to an electric power measuring system for measuring electric power to be supplied via each power line PL.

[Software Implementation Example]

Control blocks of the electric current measuring system 10 (particularly, the microcomputer section 23 and the logger section 42) can be realized by a logic circuit (hardware) provided in an integrated circuit (IC chip) or the like or can be alternatively realized by software as executed by a central processing unit (CPU).

In the latter case, the electric current measuring system 10 includes a CPU that executes instructions of a program that is software realizing the foregoing functions; a read only memory (ROM) or a storage device (each referred to as "storage medium") in which the program and various kinds of data are stored so as to be readable by a computer (or a CPU); and a random access memory (RAM) in which the program is loaded. An object of the present invention can be achieved by a computer (or a CPU) reading and executing the program stored in the storage medium. Examples of the storage medium encompass "a non-transitory tangible medium" such as a tape, a disk, a card, a semiconductor memory, and a programmable logic circuit. The program can be supplied to the computer via any transmission medium (such as a communication network or a broadcast wave) which allows the program to be transmitted. Note that the present invention can also be achieved in the form of a computer data signal in which the program is embodied via electronic transmission and which is embedded in a carrier wave.

The present invention is not limited to the embodiments, but can be altered by a skilled person in the art within the scope of the claims. An embodiment derived from a proper combination of technical means each disclosed in a different embodiment is also encompassed in the technical scope of the present invention.

For example, the electric current measuring unit 11 of each of the embodiments does not need to include the switching circuits 20. In this case, it is only necessary that the microcomputer section 23 carry out control so as to (i) measure, in accordance with an electric current from one of the plurality of current transformers CT, an electric current flowing through a power line that is provided with the one of the plurality of current transformers CT, and (ii) repeat the measurement with respect to each of the plurality of current transformers CT. Specifically, it is only necessary that the microcomputer section 23 (I) carry out control so as to (i) turn on any one of a plurality of A/D converters for carrying out analog-to-digital conversion with respect to a plurality of sensing signals from the respective sensing circuits 22, the plurality of sensing signals being based on electric currents from the plurality of current transformers CT, and transmitting the plurality of sensing signals to the measuring section 32, and (ii) turn off the other A/D converters, and (II) carry out such control with respect to each of the plurality of A/D converters.

Note that the electric current measuring unit 11 which includes the switching circuits 20 is more advantageous as described below than the electric current measuring unit 11 which includes no switching circuits 20. Specifically, since the electric current measuring unit 11 which includes the switching circuits 20 prevents an electric current from flowing from a selected switching circuit 20 to the power supply section 21, the measuring section 32 measures an electric current with higher accuracy. Further, since the electric current measuring unit 11 which includes the switching circuits 20 prevents electric currents from flowing from unselected switching circuits 20 to a sensing circuit 22, the power supply section 21 stores electricity with greater efficiency.

As described earlier, an electric current measuring device in accordance with the present invention is an electric current measuring device for causing a plurality of current transformers provided to a respective plurality of power lines to measure electric currents flowing through the plurality of power lines, the electric current measuring device including: at least one electricity storing section for storing electricity by use of electric currents from the plurality of current transformers provided to the respective plurality of power lines; an electric current measuring section for measuring, in accordance with the electric currents from the plurality of current transformers, the electric currents flowing through the plurality of power lines provided with the respective plurality of current transformers; and a control section for carrying out control so that the electric current measuring section carries out the measurement in accordance with an electric current from one of the plurality of current transformers and repeats the measurement for each of the plurality of current transformers, the electric current measuring section and the control section each operating by use of electric power from the at least one electricity storing section.

A method for controlling an electric current measuring device in accordance with the present invention for causing a plurality of current transformers provided to a respective plurality of power lines to measure electric currents flowing through the plurality of power lines, the electric current measuring device including: an electricity storing section for storing electricity by use of electric currents from the plurality of current transformers provided to the respective plurality of power lines; and an electric current measuring section for measuring, in accordance with the electric currents from the plurality of current transformers, the electric currents flowing through the plurality of power lines provided with the respective plurality of current transformers, in order to cause the electric current measuring section to operate by use of electric power from the electricity storing section, the method includes the steps of: (a) causing the electric current measuring section to carry out the measurement in accordance with an electric current from one of the plurality of current transformers; and (b) repeating the step (a) for each of the plurality of current transformers.

According to the arrangement and the method, control is carried out so that the measurement, which is carried out by the electric current measuring section in accordance with an electric current from one of the plurality of current transformers, is repeated for each of the plurality of current transformers. This causes the electric current measuring section to (i) obtain an electric current from any one of the plurality of current transformers, (ii) measure, in accordance with the obtained electric current, an electric current flowing through a power line that is provided with the any one of the plurality of current transformers, and (iii) carry out the measurement successively with respect to each of the plurality of current transformers. This makes it only necessary for the electric current measuring device to include one (1) electric current measuring section, and makes it unnecessary for the electric current measuring device to include a plurality of electric current measuring sections. As a result, the electric current measuring device can be made smaller in size.

The electricity storing section stores electricity by use of electric currents from the plurality of current transformers provided to the respective plurality of power lines. Thus, electricity is stored in a larger amount by use of the plurality of current transformers provided to the respective plurality of power lines than by use of a current transformer provided to one (1) power line PL. This allows the electricity storing section to supply required electric power to each of the electric current measuring section and the control section, and allows reliable operation of the electric current measuring device.

Examples of a measured value of an electric current include a peak value, a momentary value, a phase, an effective value, a frequency, and the like of the electric current. Examples of the electricity storing section include a capacitor, a secondary battery (storage battery), and the like. The electricity storing section can be constituted by one (1) electricity storing section, or a plurality of electricity storing sections that are provided for respective electric currents from the plurality of current transformers.

The electric current measuring device in accordance with the present invention is preferably arranged to further include: a plurality of switching sections for switching between the at least one electricity storing section and the electric current measuring section to either of which the electric currents from the plurality of current transformers are to flow, the control section carrying out control so that any one of the plurality of switching sections is selected, the selected one of the plurality of switching sections causes an electric current from a corresponding current transformer of the plurality of current transformers to flow to the electric current measuring section, whereas the other unselected switching sections cause electric currents from respective current transformers of the plurality of current transformers to flow to the at least one electricity storing section, and the selection is carried out successively with respect to each of the plurality of switching sections.

In this case, since the electric current measuring device prevents an electric current from flowing from the selected switching section to the electricity storing section, the electric current measuring section measures an electric current with higher accuracy. Further, since the electric current measuring device prevents electric currents from flowing from the unselected switching sections to the electric current measuring section, the electricity storing section stores electricity with greater efficiency.

The electric current measuring device in accordance with the present invention can be arranged such that the control section determines, in accordance with a measured value of an electric current flowing through a power line and measured by the electric current measuring section, a frequency with which to select a switching section corresponding to the power line.

In this case, by decreasing, when the measured value of the electric current is low, the frequency with which to select a switching section corresponding to the power line, it is possible to decrease a measurement frequency with which to measure the electric current. This allows the measurement frequency to be in accordance with an amount of an electric current flowing into the electricity storing section. As a result, the electric current measuring device can more reliably operate.

The electric current measuring device in accordance with the present invention can be arranged such that the control section selects the plurality of switching sections in ascending order of measured values of electric currents measured last time.

Normally, a power line which is low in measured value of an electric current measured last time is expected to be also low in measured value of the electric current measured this time. Similarly, a power line which is high in measured value of an electric current measured last time is expected to be also high in measured value of the electric current measured this time.

Thus, according to the arrangement, an electric current from a current transformer provided to a power line which is expected to be low in measured value of an electric current flows to the electric current measuring section, whereas electric currents from current transformers provided to respective power lines each of which is expected to be high in measured value of an electric current flow to the electricity storing section. Thus, electricity is expected to be rapidly stored in the electricity storing section. This allows reliable supply of required electric power from the electricity storing section to each of the electric current measuring section and the control section, and allows more reliable operation of the electric current measuring device.

The electric current measuring device in accordance with the present invention can be arranged to further include: a voltage measuring section for measuring a value of an output voltage of the at least one electricity storing section, in a case where the value of the output voltage, which value has been measured by the voltage measuring section, is lower than a first predetermined value, the control section carrying out control so that the measurement by the electric current measuring section is stopped and the selection of the plurality of switching sections is stopped.

According to the arrangement, in a case where the value of the output voltage is lower than the first predetermined value, the measurement by the electric current measuring section is stopped by the control section. This makes it possible to prevent (i) a shortage of electric power supplied from the electricity storing section and (ii) an inoperative state of the electric current measuring device, the shortage and the inoperative state each being caused in a case where the electric current measuring section carries out the measurement. Further, since the selection of the plurality of switching sections is stopped by the control section, all the electric currents from the plurality of current transformers flow to the electricity storing section. Thus, electricity is rapidly stored in the electricity storing section. This makes it possible to shorten a period before the electric current measuring section resumes the measurement.

The electric current measuring device in accordance with the present invention can be arranged to further include: a transmission section for wirelessly transmitting, to an external device, measured values of the electric currents flowing through the plurality of power lines and measured by the electric current measuring section, the transmission section operating by use of the electric power from the at least one electricity storing section, in a case where the value of the output voltage, which value has been measured by the voltage measuring section, is lower than a second predetermined value, which is higher than the first predetermined value, the control section carrying out control so that the wireless transmission by the transmission section is stopped.

According to the arrangement, in a case where the value of the output voltage is lower than the first predetermined value, the measurement by the electric current measuring section and the wireless transmission by the transmission section are stopped by the control section. This makes it possible to prevent (i) a shortage of electric power supplied from the electricity storing section and (ii) an inoperative state of the electric current measuring device, the shortage and the inoperative state each being caused in a case where the electric current measuring section carries out the measurement and the transmission section carries out the wireless transmission. In a case where the value of the output voltage is not lower than the first predetermined value and is lower than the second predetermined value, the control section causes the measurement by the electric current measuring section to be carried out, and causes the wireless transmission by the transmission section to be stopped. This allows the measurement by the electric current measuring section to be carried out, and makes it possible to prevent (i) a shortage of electric power supplied from the electricity storing section and (ii) an inoperative state of the electric current measuring device, the shortage and the inoperative state each being caused in a case where the transmission section carries out the wireless transmission. It is only necessary that a measured value of an electric current measured in this case be retained in the electric current measuring device, and thereafter when the value of the output voltage becomes not lower than the second predetermined value, a measured value of an electric current measured at this time and a measured value which is retained in the electric current measuring device and whose electric current was measured before be collectively wirelessly transmitted.

In a case where the at least one electricity storing section comprises a plurality of electricity storing sections, it is only necessary that the plurality of electricity storing sections be provided with a respective plurality of voltage measuring sections, and a total value of output voltages measured by the plurality of voltage measuring sections be compared with each of the first predetermined value and the second predetermined value.

The electric current measuring device in accordance with the present invention can be arranged such that the control section determines whether the plurality of current transformers are connected to the respective plurality of switching sections, and carries out control so that the selection is not carried out with respect to a switching section to which no current transformer is connected.

According to the arrangement, in a case where no current transformer is connected to the switching section, it is unnecessary to carry out the measurement based on an electric current from the switching section. Thus, since the selection of the switching section is not carried out in the above case, the measurement based on an electric current from the switching section is not carried out. This makes it possible to reduce (i) wasteful electric power consumption caused by the measurement and (ii) a measuring time required for the measurement. As a result, the electric current measuring device can more reliably operate.

The electric current measuring device in accordance with the present invention can be arranged such that: the at least one electricity storing section comprises a plurality of electricity storing sections that are connected to the respective plurality of switching sections, the electric current measuring device further including: a plurality of voltage measuring sections for measuring values of output voltages of the respective plurality of electricity storing sections, the control section carrying out control so that the selection is not carried out with respect to a switching section corresponding to an electricity storing section whose output voltage has a value being zero or not more than a predetermined value, the value having been measured by a corresponding voltage measuring section.

Examples of a case where the output voltage of the electricity storing section is zero or not more than a predetermined value may include a case where no current transformer is connected to the switching section corresponding to the electricity storing section, a case where a current transformer is connected to the switching section but the current transformer is not provided to a power line, or a case where a current transformer is connected to the switching section and the current transformer is provided to a power line, but no electric current flows through the power line. In any of these cases, it is unnecessary to carry out the measurement based on an electric current from the switching section. Thus, since the selection is not carried out with respect to the switching section corresponding to a relevant electricity storing section in the above cases, the measurement based on an electric current from the switching section is prevented from being carried out, so that (i) wasteful electric power consumption caused by the measurement and (ii) a measuring time required for the measurement. As a result, the electric current measuring device can more reliably operate.

The electric current measuring device in accordance with the present invention is preferably arranged to further include: a transmission section for wirelessly transmitting, to an external device, measured values of the electric currents flowing through the plurality of power lines and measured by the electric current measuring section, the transmission section operating by use of the electric power from the at least one electricity storing section.

In this case, since it is unnecessary to connect the electric current measuring device and the external device via a cable, convenience is enhanced. Further, the electricity storing section stores therein electricity in a large amount as described earlier. This allows the electricity storing section to supply required electric power to each of the electric current measuring section, the control section, and the transmission section, and allows reliable operation of the electric current measuring device.

The electric current measuring device in accordance with the present invention is preferably arranged such that the transmission section collectively wirelessly transmits the measured values of the electric currents. This case, in which the measured values of the electric currents or a plurality of pieces of related information are collectively wirelessly transmitted, further allows a reduced amount of electric power consumption than a case where the measured values are separately wirelessly transmitted. Thus, the electric current measuring device can more reliably operate.

The electric current measuring device in accordance with the present invention can be arranged such that the control section controls the transmission section so that for each of the plurality of power lines, in a case where a difference between (a) a measured value of an electric current measured this time by the electric current measuring section and (b) a measured value of an electric current, which measured value was wirelessly transmitted last time, falls within a predetermined range, the transmission section does not wirelessly transmit the measured value of the electric current measured this time.

With the arrangement, in a case where the measured value of the electric current does not change so much, wireless transmission of the measured value is omitted. Such a case allows a lower amount of electric power consumption than a case where measured values of all electric currents are wirelessly transmitted. This allows more reliable operation of the electric current measuring device.

In a case where the wireless transmission is omitted for a long period, it is difficult to determine whether a measured value of an electric current flowing through a power line does not change so much, or whether the measured value is too low to measure. In view of this, a period in which the wireless transmission is omitted is preferably limited to a predetermined period.

An electric power measuring device for measuring electric power supplied via a respective plurality of power lines, the electric power measuring device including: an electric current measuring device arranged as described earlier, for causing a plurality of current transformers provided to the respective plurality of power lines to measure electric currents flowing through the plurality of power lines; a voltage measuring section for measuring voltages across the respective plurality of power lines; and an electric power measuring section for measuring, in accordance with the electric currents measured by the electric current measuring device and the voltages measured by the voltage measuring section, the electric power supplied via the respective plurality of power lines, can yield an effect similar to those described earlier.

The electric current measuring device in accordance with the foregoing embodiments of the present invention can be realized by a computer. In this case, the present invention encompasses: a control program for the electric current measuring device which program causes a computer to operate as the foregoing sections of the electric current measuring device so that the electric current measuring device can be realized by the computer; and a computer-readable recording medium in which the control program is recorded.

INDUSTRIAL APPLICABILITY

According to the present invention, an electric current is obtained from any one of a plurality of current transformers, an electric current flowing through a power line that is provided with the any one of the plurality of current transformers is measured in accordance with the obtained electric current, and the measurement is carried out successively with respect to each of the plurality of current transformers. Thus, the present invention (i) allows an electric current measuring device to be smaller in size and (ii) allows reliable operation of the electric current measuring device due to storage of electricity by use of electric currents from a plurality of current transformers provided to respective plurality of power lines. In view of this, the present invention is applicable to any electric power measuring device for causing a current transformer to measure an electric current.

REFERENCE SIGNS LIST

10 Electric current measuring system
11 Electric current measuring unit (electric current measuring device)
12 Receiving unit
20 Switching circuit (switching section)
21 Power supply section (electricity storing section)
22 Sensing circuit
23 Microcomputer section
24 Wireless transmission section (transmission section)
30 Memory section
31 Switching instructing section (control section)
32 Measuring section (electric current measuring section)
33 Data sending section
40 Receiving section
41 Operation section
42 Logger section
43 Recording section
44 Display section
50 Charging section
51 Charging voltage sensing circuit (voltage measuring section)

52 Switching circuit
53 DC/DC converter

The invention claimed is:

1. An electric current measuring device for causing a plurality of current transformers provided to a respective plurality of power lines to measure electric currents flowing through the plurality of power lines, said electric current measuring device comprising:
at least one electricity storing section for storing electricity by use of electric currents from the plurality of current transformers provided to the respective plurality of power lines;
an electric current measuring section for measuring, in accordance with the electric currents from the plurality of current transformers, the electric currents flowing through the plurality of power lines provided with the respective plurality of current transformers;
a control section for carrying out control so that the electric current measuring section carries out the measurement in accordance with an electric current from one of the plurality of current transformers and repeats the measurement for each of the plurality of current transformers; and
a plurality of switching sections for switching between the at least one electricity storing section and the electric current measuring section to either of which the electric currents from the plurality of current transformers are to flow,
the electric current measuring section and the control section each operating by use of electric power from the at least one electricity storing section.

2. The electric current measuring device as set forth in claim 1, further comprising:
the control section carrying out control so that any one of the plurality of switching sections is selected, the selected one of the plurality of switching sections causes an electric current from a corresponding current transformer of the plurality of current transformers to flow to the electric current measuring section, whereas the other unselected switching sections cause electric currents from respective current transformers of the plurality of current transformers to flow to the at least one electricity storing section, and the selection is carried out successively with respect to each of the plurality of switching sections.

3. The electric current measuring device as set forth in claim 2, wherein the control section determines, in accordance with a measured value of an electric current flowing through a power line and measured by the electric current measuring section, a frequency with which to select a switching section corresponding to the power line.

4. The electric current measuring device as set forth in claim 2, wherein the control section selects the plurality of switching sections in ascending order of measured values of electric currents measured last time.

5. The electric current measuring device as set forth in claim 2, further comprising:
a voltage measuring section for measuring a value of an output voltage of the at least one electricity storing section,
in a case where the value of the output voltage, which value has been measured by the voltage measuring section, is lower than a first predetermined value, the control section carrying out control so that the measurement by the electric current measuring section is stopped and the selection of the plurality of switching sections is stopped.

6. The electric current measuring device as set forth in claim 5, further comprising:
a transmission section for wirelessly transmitting, to an external device, measured values of the electric currents flowing through the plurality of power lines and measured by the electric current measuring section, the transmission section operating by use of the electric power from the at least one electricity storing section,
in a case where the value of the output voltage, which value has been measured by the voltage measuring section, is lower than a second predetermined value, which is higher than the first predetermined value, the control section carrying out control so that the wireless transmission by the transmission section is stopped.

7. The electric current measuring device as set forth in claim 2, wherein the control section determines whether the plurality of current transformers are connected to the respective plurality of switching sections, and carries out control so that the selection is not carried out with respect to a switching section to which no current transformer is connected.

8. The electric current measuring device as set forth in claim 2, wherein:
the at least one electricity storing section comprises a plurality of electricity storing sections that are connected to the respective plurality of switching sections,
said electric current measuring device further comprising:
a plurality of voltage measuring sections for measuring values of output voltages of the respective plurality of electricity storing sections,
the control section carrying out control so that the selection is not carried out with respect to a switching section corresponding to an electricity storing section whose output voltage has a value being zero or not more than a predetermined value, the value having been measured by a corresponding voltage measuring section.

9. The electric current measuring device as set forth in claim 1:
a transmission section for wirelessly transmitting, to an external device, measured values of the electric currents flowing through the plurality of power lines and measured by the electric current measuring section, the transmission section operating by use of the electric power from the at least one electricity storing section.

10. The electric current measuring device as set forth in claim 9, wherein the transmission section collectively wirelessly transmits the measured values of the electric currents.

11. The electric current measuring device as set forth in claim 9, wherein the control section controls the transmission section so that for each of the plurality of power lines, in a case where a difference between (a) a measured value of an electric current measured this time by the electric current measuring section and (b) a measured value of an electric current, which measured value was wirelessly transmitted last time, falls within a predetermined range, the transmission section does not wirelessly transmit the measured value of the electric current measured this time.

12. An electric power measuring device for measuring electric power supplied via a respective plurality of power lines,
said electric power measuring device comprising:
an electric current measuring device recited in claim 1, for causing a plurality of current transformers provided to the respective plurality of power lines to measure electric currents flowing through the plurality of power lines;

a voltage measuring section for measuring voltages across the respective plurality of power lines; and an electric power measuring section for measuring, in accordance with the electric currents measured by the electric current measuring device and the voltages measured by the voltage measuring section, the electric power supplied via the respective plurality of power lines.

13. A method for controlling an electric current measuring device for causing a plurality of current transformers provided to a respective plurality of power lines to measure electric currents flowing through the plurality of power lines, the electric current measuring device including:

an electricity storing section for storing electricity by use of electric currents from the plurality of current transformers provided to the respective plurality of power lines; and an electric current measuring section for measuring, in accordance with the electric currents from the plurality of current transformers, the electric currents flowing through the plurality of power lines provided with the respective plurality of current transformers; and a plurality of switching sections, in order to cause the electric current measuring section to operate by use of electric power from the electricity storing section, said method comprising the steps of:

(a) causing the electric current measuring section to carry out the measurement in accordance with an electric current from one of the plurality of current transformers;

(b) switching, using the plurality of switching sections, between the at least one electricity storing section and the electric current measuring the section to either of which the electric currents from the plurality of current transformers are to flow; and (c) repeating the step (a) and the step (b) for each of the plurality of current transformers.

14. A non-transitory, computer-readable recording medium in which a control program for causing a computer to function as an electric current measuring device recited in claim 1, the control program causing the computer to function as each section of the electric current measuring device.

* * * * *